(12) United States Patent
Eom et al.

(10) Patent No.: US 12,230,348 B2
(45) Date of Patent: Feb. 18, 2025

(54) CONTROL METHOD, SEMICONDUCTOR MEMORY, AND ELECTRONIC DEVICE

(71) Applicant: CHANGXIN MEMORY TECHNOLOGIES, INC., Hefei (CN)

(72) Inventors: Yoonjoo Eom, Hefei (CN); Lin Wang, Hefei (CN); Zhiqiang Zhang, Hefei (CN); Yuanyuan Gong, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 178 days.

(21) Appl. No.: 18/155,124

(22) Filed: Jan. 17, 2023

(65) Prior Publication Data
US 2023/0307081 A1    Sep. 28, 2023

Related U.S. Application Data

(63) Continuation of application No. PCT/CN2022/093942, filed on May 19, 2022.

(30) Foreign Application Priority Data

Mar. 25, 2022  (CN) .......................... 202210307454.8
May 9, 2022    (CN) .......................... 202210498332.1

(51) Int. Cl.
*G11C 29/14*    (2006.01)
*G11C 29/36*    (2006.01)
*G11C 29/46*    (2006.01)

(52) U.S. Cl.
CPC .............. *G11C 29/46* (2013.01); *G11C 29/14* (2013.01); *G11C 29/36* (2013.01)

(58) Field of Classification Search
CPC ......... G11C 29/46; G11C 29/14; G11C 29/36; G11C 7/1009; G11C 29/022;
(Continued)

(56) References Cited

U.S. PATENT DOCUMENTS

| 7,707,469 | B2 | 4/2010 | Lee |
| 8,804,448 | B2 | 8/2014 | Park |

(Continued)

FOREIGN PATENT DOCUMENTS

| CN | 103378826 A | 10/2013 |
| CN | 103780257 A | 5/2014 |

(Continued)

OTHER PUBLICATIONS

Japanese Patent Office, Office Action Issued in Application No. 2022-549059, Apr. 16, 2024, 6 pages.

(Continued)

*Primary Examiner* — Xiaochun L Chen
(74) *Attorney, Agent, or Firm* — Syncoda LLC; Feng Ma

(57) ABSTRACT

Embodiments of the present disclosure provide a control method, a semiconductor memory, and an electronic device. When the semiconductor memory is in a preset test mode, a first Model Register (MR) and a second MR related to a Data Pin (DQ) are allowed to directly define the impedance of a Data Mask Pin (DM). The DM does not need to add definition of an output driver state and a related control circuit for the preset test mode to ensure that the preset test mode is adapted to the DM. The impedance of the DM may be tested in the preset test mode to avoid circuit processing errors.

22 Claims, 13 Drawing Sheets

— S101

When a semiconductor memory is in a preset test mode, in response to a Data Mask Pin (DM) being selected as a test object, control the impedance of the DM to be a first impedance parameter through a first Model Register (MR); or, in response to the DM not being selected as the test object, control the impedance of the DM to be a second impedance parameter through a second MR

(58) Field of Classification Search
CPC ............ G11C 29/028; G11C 29/50008; G11C 7/1045; G11C 11/4096; G11C 29/56
See application file for complete search history.

(56) References Cited

U.S. PATENT DOCUMENTS

| | | |
|---|---|---|
| 10,361,699 B2 | 7/2019 | Lee et al. |
| 2005/0007835 A1 | 1/2005 | Lee |
| 2005/0226080 A1 | 10/2005 | Lee |
| 2006/0262611 A1 | 11/2006 | Lee |
| 2007/0204185 A1 | 8/2007 | Ogura |
| 2007/0291575 A1 | 12/2007 | Lee |
| 2008/0052571 A1 | 2/2008 | Lee |
| 2009/0059680 A1 | 3/2009 | Lee |
| 2009/0122850 A1 | 5/2009 | Lee |
| 2010/0054053 A1 | 3/2010 | Lee |
| 2011/0102091 A1 | 5/2011 | Yeric |
| 2011/0242918 A1* | 10/2011 | Jeong ............... G11C 29/02 365/201 |
| 2012/0239337 A1 | 9/2012 | Matsuo |
| 2013/0049875 A1 | 2/2013 | Shiga |
| 2013/0271196 A1 | 10/2013 | Cao |
| 2013/0286759 A1 | 10/2013 | Park |
| 2014/0298125 A1 | 10/2014 | Devadze et al. |
| 2015/0016200 A1 | 1/2015 | Cha et al. |
| 2015/0084668 A1 | 3/2015 | Yun |
| 2017/0331476 A1 | 11/2017 | Cho et al. |
| 2019/0052268 A1 | 2/2019 | Lee et al. |

FOREIGN PATENT DOCUMENTS

| | | |
|---|---|---|
| CN | 104113331 A | 10/2014 |
| CN | 102072781 B | 2/2015 |
| CN | 106330149 A | 1/2017 |
| CN | 106372539 A | 2/2017 |
| CN | 107393576 A | 11/2017 |
| CN | 109390011 A | 2/2019 |
| JP | 2005039549 A | 2/2005 |
| JP | 2009026359 A | 2/2009 |
| JP | 2009276174 A | 11/2009 |
| JP | 2013534014 A | 8/2013 |
| JP | 2018200739 A | 12/2018 |

OTHER PUBLICATIONS

Micron Technology, Inc, "DDR5 SDRAM, Product Core Data Sheet", DDR5 SDRAM Features, 2021. 10, the whole document. 529 pages.
Hae-Kang Jung et al., "A 4.35Gb/s/pin LPDDR4 I/O Interface with Multi-VOH Level, Equalization Scheme, and Duty-Training Circuit for Mobile Applications", 2015 Symposium on VLSI Circuits Digest of Technical Papers, 2015. 06, the whole document. 2 pages.
First Office Action of the Korean application No. 10-2022-7027987, issued on Jan. 29, 2024. 14 pages with English translation.
First Office Action of the Korean application No. 10-2022-7028280, issued on Jan. 29, 2024. 12 pages with English translation.
First Office Action of the Korean application No. 10-2022-7028352, issued on Jan. 29, 2024. 12 pages with English translation.

* cited by examiner

When a semiconductor memory is in a preset test mode, in response to a Data Mask Pin (DM) being selected as a test object, control the impedance of the DM to be a first impedance parameter through a first Model Register (MR); or, in response to the DM not being selected as the test object, control the impedance of the DM to be a second impedance parameter through a second MR

CONTROL METHOD, SEMICONDUCTOR MEMORY, AND ELECTRONIC DEVICE

CROSS-REFERENCE TO RELATED APPLICATIONS

This is a continuation of International Application No. PCT/CN2022/093942, filed on May 19, 2022, which is based upon and claims priority to Chinese Patent Application No. 202210307454.8, filed on Mar. 25, 2022, and Chinese Patent Application No. 202210498332.1, filed on May 9, 2022. The disclosures of International Application No. PCT/CN2022/093942, Chinese Patent Application No. 202210307454.8, and Chinese Patent Application No. 202210498332.1 are hereby incorporated by reference in their entireties.

TECHNICAL FIELD

The present disclosure relates to the technical field of semiconductors, in particular to a control method, a semiconductor memory and an electronic device.

BACKGROUND

A Dynamic Random Access Memory (DRAM) is a semiconductor memory device commonly used in computers, at least having a Data Pin (DQ) and a Data Mask Pin (DM). Herein, the DQ has dual functions of data write and data read, and the DM is configured to receive an input mask signal of the write data and shield unnecessary input data during the write operation, and only supports the data write function. In the fifth edition of the memory specification (alternatively referred to as Double Data Rate 5 SDRAM (DDR5)), some test modes need to test the impedance of the DM or the DQ.

SUMMARY

In a first aspect, embodiments of the present disclosure provide a control method, applied to a semiconductor memory. The semiconductor memory may include a DM. The DM may be configured to receive an input mask signal of write data. The method may include the following operations.

When the semiconductor memory is in a preset test mode, in response to the DM being selected as a test object, the impedance of the DM is controlled to be a first impedance parameter through a first Model Register (MR); or, in response to the DM not being selected as the test object, the impedance of the DM is controlled to be a second impedance parameter through a second MR.

Herein, the semiconductor memory further includes at least one DQ, the DQ is configured to receive or output data, the first MR is configured to indicate that the impedance of the at least one DQ in an output driver state is the first impedance parameter, and the second MR is configured to indicate that the impedance of the at least one DQ in a termination state is the second impedance parameter.

In a second aspect, the embodiments of the present disclosure provide a semiconductor memory. The semiconductor memory includes a first MR, a second MR, a DM, and a first driver circuit connected to the first MR, the second register and the DM respectively.

The DM is configured to receive an input mask signal of write data.

The first driver circuit is configured to, when the semiconductor memory is in a preset test mode, control the impedance of the DM to be a first impedance parameter according to the first MR, in response to the DM being selected as a test object, or control the impedance of the DM to be the second impedance parameter according to the second MR, in response to the DM not being selected as the test object.

Herein, the semiconductor memory further includes at least one DQ, the DQ may be configured to receive or output data, the first MR is configured to indicate that the impedance of the at least one DQ in an output driver state is the first impedance parameter, and the second MR is configured to indicate that the impedance of the at least one DQ in a termination state is the second impedance parameter.

In a third aspect, the embodiments of the present disclosure provide an electronic device, which includes the semiconductor memory described in the second aspect.

BRIEF DESCRIPTION OF THE DRAWINGS

FIG. 1 is a flowchart of a control method according to an embodiment of the present disclosure.

DETAILED DESCRIPTION

Figure 2:
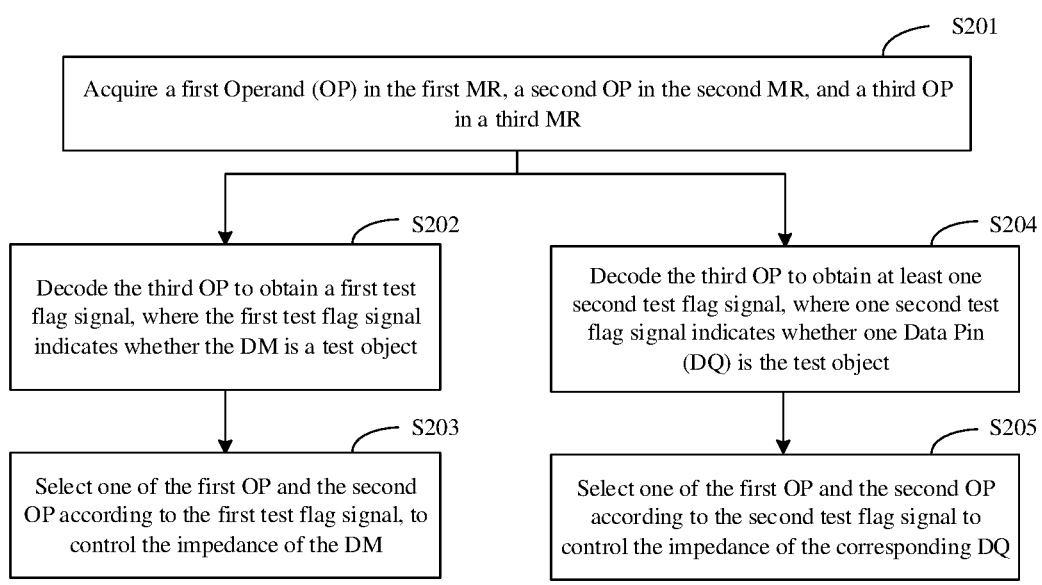
FIG. 2 is a flowchart of another control method according to an embodiment of the present disclosure.

The technical solutions in the embodiments of the present disclosure will be clearly and completely described in conjunction with the drawings in the embodiments of the present disclosure. It should be understood that that the specific embodiments described herein are only used to illustrate the relevant disclosure, but are not intended to limit the disclosure. In addition, it is to be noted that, for the convenience of description, only the parts related to the relevant disclosure are shown in the drawings.

Unless otherwise defined, all technical and scientific terms used herein have the same meaning as commonly understood by those skilled in the art of the present disclosure. The terms used herein are only for the purpose of describing the embodiments of the present disclosure and are not intended to limit the present disclosure.

In the following description, reference is made to "some embodiments" which describe a subset of all possible embodiments, but it should be understood that "some embodiments" may be the same or different subsets of all possible embodiments, and may be combined with each other without conflict.

It is to be noted that the terms "first\second\third" involved in the embodiments of the present disclosure are only used to distinguish similar objects, and do not represent a specific order of the objects. It should be understood that the specific order or sequence of "first\second\third" may be interchangeable under the allowable circumstances, so that the embodiments of the disclosure described herein may be implemented in an order other than those illustrated or described herein.

The following are explanations of professional terms involved in the embodiments of the present disclosure and the corresponding relationship of some nouns:

Dynamic Random Access Memory (DRAM)
Synchronous Dynamic Random Access Memory (SDRAM)
Double Data Rate SDRAM (DDR)
DDR5 Specification (DDR5 SPEC)
Data Pin (DQ)
Data Mask Pin (DM)
Package Output Driver Test Mode (PODTM)
Mode Register (MR)
Operand (OP)

DDR5 SPEC specifies a new test mode, referred to as the PODTM, which is configured to enable an Output Driver of the DQ or the DM through a host after a chip is packaged, while making other DQs or DMs be in a termination state, so as to test whether the pull-up impedance of the enabled DQ or the DM in an output driver state meets expectation. However, since the output driver state of the DM is not defined originally, the PODTM may not be adapted to the DM, and circuit processing errors are easily caused.

Based on this, the embodiments of the present disclosure provide a control method. When a semiconductor memory is in a preset test mode, a first MR and a second MR related to the DQ are allowed to directly define the impedance of the DM. For the DM, there is no need to add definition of the output driver state and a related control circuit for the preset test mode to ensure that the preset test mode is adapted to the DM. The impedance of the DM may be tested in the preset test mode to avoid the circuit processing errors.

The embodiments of the present disclosure will be described in detail below with reference to the accompanying drawings.

In an embodiment of the present disclosure, referring to FIG. 1, which shows a flowchart of a control method according to an embodiment of the present disclosure. As shown in FIG. 1, the method may include the following operations.

At S101, when a semiconductor memory is in a preset test mode, in response to a DM being selected as a test object, the impedance of the DM is controlled to be a first impedance parameter through a first MR; or, in response to the DM not being selected as the test object, the impedance of the DM is controlled to be a second impedance parameter through a second MR.

It is to be noted that the control method is applied to the semiconductor memory. The semiconductor memory includes the DM and at least one DQ. Herein, the DQ is configured to receive or output data, and has a Write function or a Read function, and is operable in a termination state or an output driver state. The DM is configured to receive an input mask signal of write data, and only has the Write function, and is operable in the termination state.

In the embodiment of the present disclosure, the preset test mode refers to a PODTM introduced in DDR5, and the PODTM is configured to test the impedance of the DM or the at least one DQ after packaging. More specifically, the PODTM allows a host to test the pull-up impedance of the DM or the DQ.

When the DM is selected as the test object in the PODTM, the first MR is allowed to control the impedance of the DM to be the first impedance parameter. Here, since the first MR is configured to indicate the Pull-up impedance of the DQ in the output driver state, the host may test the pull-up impedance related to the output drive of the DM, and there is no need to define the output driver state of the DM.

When the DM is not the test object in the PODTM, the second MR is allowed to control the impedance of the DM to be the second impedance parameter. Here, since the second MR is configured to indicate the impedance in the termination state, the influence of the DM on a test result of the selected test object may be avoided.

In this way, when the semiconductor memory is in the preset test mode, the first MR and the second MR are allowed to directly define the impedance of the DM. For the DM, there is no need to add definition of the output driver state and the related control circuit for the preset test mode to ensure that the preset test mode is adapted to the DM, and the impedance of the DM may be tested in the preset test mode to avoid the circuit processing errors.

In some embodiments, the method further includes the following operations.

When the semiconductor memory is in the preset test mode, in response to the DQ being selected as the test object, the impedance of the DQ is controlled to be the first impedance parameter through the first MR; or, in response to the DQ not being selected as the test object, the impedance of the DQ is controlled to be the second impedance parameter through the second MR.

In this way, when the DQ is selected as the test object in the PODTM, the pull-up output driver impedance of the DQ is controlled through the first MR, so as to obtain the test result of the DQ. When the DQ is not taken as the test object in the PODTM, the DQ is controlled to be in the termination state through the second MR, so as to avoid the influence of the DQ on the test result of the selected test object.

In some embodiments, it is determined that the semiconductor memory enters the preset test mode and selects the test object through a third MR; or, it is determined that the semiconductor memory does not enter the preset test mode through the third MR.

It should be understood that each MR has a plurality of OP bits to provide corresponding control functions. In the embodiment of the present disclosure, the OP related to the embodiment of the present disclosure in the first MR is referred to as a first OP, the OP related to the embodiment of the present disclosure in the second MR is referred to as a second OP, and the OP related to the embodiment of the present disclosure in the third MR is referred to as a third OP.

That is, in the embodiment of the present disclosure, it is determined whether the semiconductor memory enters the PODTM through the third OP in the third MR, and in the case of entering the PODTM, the test object is selected from the DM and the at least one data DQ. Then, the impedance of the selected test object is controlled to be the first impedance parameter (essentially the pull-up output driver impedance) through the first OP in the first MR, and the impedance of an unselected pin is controlled to be the second impedance parameter (essentially the termination impedance) through the second OP in the second MR, so as to obtain the impedance test result of the test object. For the DM, there is no need to add definition of the output driver state and the related control circuit for the preset test mode to ensure that the preset test mode is adapted to the DM, and the impedance of the DM can be tested in the preset test mode to avoid the circuit processing errors.

In some embodiments, the standard serial number of the first MR is 5, and the first OP refers to an OP from the second bit to the first bit stored in the first MR, represented as MR5 OP[2:1]. The standard serial number of the second MR is 34, and the second OP refers to an OP from the second bit to the 0th bit stored in the second MR, represented as MR34 OP[2:0]. The standard serial number of the third MR is 61, and the third OP refers to an OP from the 4th bit to the 0th bit stored in the third MR, represented as MR61 OP[4:0]. Here, the standard serial number refers to the serial number of the MR in the DDR5.

The third OP MR61 OP[4:0], the first OP MR5 OP[2:1], and the second OP MR34 OP[2:0] are specifically described below in conjunction with Tables 1 to 3.

As shown in Table 1, MR61 OP[4:0] is configured to determine whether to enter the PODTM, and to determine the selected pin. It should be understood that the numbers of DMs and the DQs are different for the semiconductor memories of different bits. For a 4-bit (X4) memory, there is one low-bit DM (represented as DML) and four low-bit DQs (respectively referred to as DQL0-DQL3). For an 8-bit (X8) memory, there is one low-bit DM (represented as DML) and eight low-bit DQs (respectively referred to as DQL0-DQL7). For a 16-bit (X16) memory, there is one low-bit DM (represented as DML), one high-bit DM (represented as DMU), eight low-bit DQs (respectively referred to as DQL0-DQL8) and eight high-bit DQs (respectively referred to as DQU0-DQU8).

If MR61 OP[4:0]=00000B, it means that the semiconductor memory is not in the PODTM. If a value of MR61 OP[4:0] is any combination other than 00000B in Table 1, it means that the semiconductor memory is in the PODTM. Specifically, if MR61 OP[4:0]=$00001_B$, it means that the test object is the DML. If MR61 OP[4:0]=$00010_B$, it means that the test object is the DMU (only effective for the 16-bit memory). If MR61 OP[4:0]=$10000_B$, it means that the test object is the 0-bit DQ DQL0. Others may be understood by reference, and may not be explained one by one.

TABLE 1

| MR and OP bit | Function | Parameter description |
| --- | --- | --- |
| MR61 OP[4:0] | Package Output Driver Test Mode | $00000_B$: Package Test Disabled (Default)<br>$00001_B$: Package Test DML<br>$00010_B$: Package Test DMU (X16 only)<br>$10000_B$: Package Test DQL0<br>$10001_B$: Package Test DQL1<br>$10010_B$: Package Test DQL2<br>$10011_B$: Package Test DQL3 |

TABLE 1-continued

| MR and OP bit | Function | Parameter description |
| --- | --- | --- |
| | | $10100_B$: Package Test DQL4 (X8 and X16 Only)<br>$10101_B$: Package Test DQL5 (X8 and X16 Only)<br>$10110_B$: Package Test DQL6 (X8 and X16 Only)<br>$10111_B$: Package Test DQL7 (X8 and X16 Only)<br>$11000_B$: Package Test DQU0 (X16 Only)<br>$11001_B$: Package Test DQU1 (X16 Only)<br>$11010_B$: Package Test DQU2 (X16 Only)<br>$11011_B$: Package Test DQU3 (X16 Only)<br>$11100_B$: Package Test DQU4 (X16 Only)<br>$11101_B$: Package Test DQU5 (X16 Only)<br>$11110_B$: Package Test DQU6 (X16 Only)<br>$11111_B$: Package Test DQU7 (X16 Only) |

As shown in Table 2, MR5 OP[2:1] is configured to determine the Pull-up Output Driver Impedance of the DQ, so that the impedance of the selected pin is controlled to be the first impedance parameter through MR5 OP[2:1] in the PODTM.

If MR5 OP[2:1]=$00_B$, it means that the pull-up input driver impedance should be RZQ/7, that is, 34 ohms. If MR5 OP[2:1]=$01_B$, it means that the pull-up input driver impedance should be RZQ/6, that is, 40 ohms. If MR5 OP[2:1]=$10_B$, it means that the pull-up input driver impedance should be RZQ/5, that is, 48 ohms. Here, RZQ is the standard resistance value, that is, 240 ohms.

TABLE 2

| MR and OP bit | Function | Parameter description |
| --- | --- | --- |
| MR5 OP[2:1] | Pull-up Output Driver Impedance | $00_B$: RZQ/7 (34)<br>$01_B$: RZQ/6 (40)<br>$10_B$: RZQ/5 (48) |

As shown in Table 3, MR34 OP[2:0] is configured to determine the termination impedance (RTT_PARK) of the DQ or the DM, so that the impedance of the unselected pin is controlled to be the second impedance parameter through MR34 OP[2:0] in the PODTM.

If MR5 OP[2:0]=$001_B$, it means that the termination impedance is RZQ, that is, 240 ohms. If MR5 OP[2:0]=$010_B$, it means that the termination impedance is RZQ/2, that is, 120 ohms. Others may be understood by reference, and may not be explained one by one.

TABLE 3

| MR and OP bit | Function | Parameter description |
| --- | --- | --- |
| MR34 OP[2:0] | RTT_PARK | $000_B$: RTT_OFF default<br>$001_B$: RZQ (240)<br>$010_B$: RZQ/2 (120)<br>$011_B$: RZQ/3 (80)<br>$100_B$: RZQ/4 (60)<br>$101_B$: RZQ/5 (48)<br>$110_B$: RZQ/6 (40)<br>$111_B$: RZQ/7 (34) |

In addition, the unexplained parts in Tables 1 to 3 may be understood with reference to the DDR5 SPEC.

As can be seen from the above, when the DRAM is in the PODTM, the Host is allowed to independently turn on the output driver circuit of the single pin in the DRAM and control other pins to be in the termination state at the same time, so as to perform a characteristic test on the packaged DRAM. In order to enable the PODTM, the host selects the DM or the DQ as a target test object by setting MR61:OP[4:0], and the host also controls the pull-up impedance value of the output driver circuit of the target test object to be 34 ohms by setting MR5 OP[2:1]=00$_B$. Meanwhile, the impedance state of the remaining DMs or DQs in the DRAM is defined as RTT_PARK by MR34 OP[2:0]. It is to be noted that whether the DM is enabled is defined by MR5 OP[5]. In addition, if the DM is selected as the target test object in the PODTM, the DRAM may set the impedance of the DM according to MR5 OP[2:1].

In order to realize the above mechanism, a specific signal processing method is exemplarily provided below.

As shown in FIG. 2, in some embodiments, in the case of determining that the semiconductor memory enters the preset test mode, the method further includes the following operations.

At S201, the first OP in the first MR, the second OP in the second MR, and the third OP in the third MR are acquired.

At S202, the third OP is decoded to obtain a first test flag signal. Herein, the first test flag signal indicates whether the DM is the test object.

At S203, one of the first OP and the second OP is selected to control the impedance of the DM according to the first test flag signal.

In some embodiments, in the case of determining that the semiconductor memory enters the preset test mode, after S201, the method further includes the following operations.

At S204, the third OP is decoded to obtain at least one second test flag signal.

Herein, one second test flag signal indicates whether one DQ is the test object.

At S205, one of the first OP and the second OP is selected to control the impedance of the corresponding DQ according to the second test flag signal.

It should be understood that the order of execution of S202 and S204 is not defined. Meanwhile, S203 is executed after S202, and S205 is executed after S204.

It is to be noted that the first test flag signal is an internal flag signal introduced for the DM to indicate whether the DM is the test object in the PODTM. The second test flag signal is an internal flag signal introduced for the DQ to indicate whether the DQ is the test object in the PODTM. Both the first test flag signal and the second test flag signal are obtained by decoding MR61 OP[4:0], seeing Table 1 above for details.

In some embodiments, for the DM, the method further includes the following operations.

A first non-test state control signal and a second impedance control signal are determined.

When the semiconductor memory is in the preset test mode, a first impedance control signal is determined based on one of the first OP and the second OP according to the first test flag signal. Or, when the semiconductor memory is not in the preset test mode, the first impedance control signal is determined based on the first non-test state control signal.

One of the first impedance control signal and the second impedance control signal is selected to control the impedance of the DM according to the working state of the semiconductor memory.

It is to be noted that although the functions of the DM and the DQ are different, the DM and the DQ adopt similar signal control principles and circuit structures for the convenience of industrial manufacturing. Specifically, each pin may be regarded as having a read-related attribute and a write-related attribute, and the final impedance of each pin is controlled by an effective signal in a signal corresponding to the read-related attribute and a signal corresponding to the write-related attribute. Therefore, each pin respectively supports a Read function and a Write function under different working scenarios (though the read function of the DM is disabled).

In one case, the first non-test state control signal is configured to indicate the impedance of the DM in a state other than the preset test state, and the second impedance control signal is configured to indicate the impedance of the DQ in the output driver state. Here, the impedance of the DM in the state other than the preset test state may include the impedance during the normal write operation and the impedance when no write or read operation is being performed, each belonging to the write-related attribute.

At this time, the first non-test state control signal may be understood as the signal corresponding to the write-related attribute, and the second impedance control signal may be understood as the signal corresponding to the read-related attribute. In this way, in the PODTM, the first impedance control signal corresponding to the PODTM is determined according to one of the first OP or the second OP. Or in the non-PODTM, the first impedance control signal corresponding to the write-related attribute is determined according to the first non-test state control signal. Then, according to the working state of the semiconductor memory, the impedance of the DM is controlled by using the PODTM or the first impedance control signal corresponding to the write-related attribute or the second impedance control signal corresponding to the read-related attribute. Specifically, the working states of the semiconductor memory may include a write state, a read state, a non-read and non-write state, and a preset test mode (PODTM). Herein, (1) when the semiconductor memory is in the write state or the non-read and non-write state or the preset test mode, the impedance of the DM is controlled by using the first impedance control signal. (2) When the semiconductor memory is in the read state, the impedance of the DM is controlled by using the second impedance control signal.

In this way, by merging a signal control strategy of the DM in the PODTM into a signal control strategy of the write-related attribute, the impedance control in the PODTM is realized.

In another case, the first non-test state control signal is configured to indicate the impedance of the DQ in the output driver state, and the second impedance control signal is configured to indicate the impedance of the DM in a state other than the preset test state.

At this time, the first non-test state control signal may be understood as a signal corresponding to the read-related attribute, and the second impedance control signal may be understood as a signal corresponding to the write-related attribute. In this way, in the PODTM, the first impedance control signal corresponding to the PODTM is determined according to one of the first OP or the second OP. Or in the non-PODTM, the first impedance control signal corresponding to the read-related attribute is determined according to the first non-test state control signal. Then, according to the working state of the semiconductor memory, the impedance of the DM is controlled by using the PODTM or the first impedance control signal corresponding to the read-related attribute or the second impedance control signal corresponding to the write-related attribute. Specifically, the working states of the semiconductor memory may include the write state, the read state, the non-read and non-write state, and the preset test mode (PODTM). Herein, (1) when the semiconductor memory is in the write state or the non-read and non-write state, the impedance of the DM is controlled by using the second impedance control signal. (2) When the semiconductor memory is in the read state or the preset test mode, the impedance of the DM is controlled by using the first impedance control signal.

In this way, by merging the signal control strategy of the DM in the PODTM into a signal control strategy of the read-related attribute, the impedance control of the PODTM is realized.

Similarly, a specific signal control method for the DQ is exemplarily provided below.

In some embodiments, for the DQ, the method further includes the following operations.

A third non-test state control signal, a fourth impedance control signal and a fifth impedance control signal are determined.

When the semiconductor memory is in the preset test mode, a third impedance control signal is determined based on one of the first OP and the second OP according to the second test flag signal. Or, when the semiconductor memory is not in the preset test mode, the third impedance control signal is determined based on the third non-test state control signal.

The third impedance control signal and the fifth impedance control signal are selected to control the impedance of the DQ according to the working state of the semiconductor memory, or the fourth impedance control signal and the fifth impedance control signal are selected to control the impedance of the DQ.

Therefore, in one case, the third non-test state control signal is configured to indicate the impedance of the corresponding DQ in the termination state, and the fourth impedance control signal and the fifth impedance control signal are jointly configured to indicate the impedance of the corresponding DQ in the output driver state. Specifically, the working states of the semiconductor memory may include the write state, the read state, the non-read and non-write state, and the preset test mode (PODTM). Herein, (1) when the semiconductor memory is in the write state or the non-read and non-write state or the preset test mode, the impedance of the DQ is controlled by using the second impedance control signal. (2) When the semiconductor memory is in the read state, the impedance of the DQ is controlled by using the fourth impedance control signal and the fifth impedance control signal.

In this way, by merging a signal control strategy of the DQ in the PODTM into the signal control strategy of the write-related attribute, the impedance control of the PODTM is realized.

In another case, the third non-test state control signal and the fifth impedance control signal are jointly configured to indicate the impedance of the corresponding DQ in the output driver state, and the fourth impedance control signal is configured to indicate the impedance of the corresponding DQ in the termination state. Specifically, the working states of the semiconductor memory may include the write state, the read state, the non-read and non-write state, and the preset test mode (PODTM). Herein, (1) when the semiconductor memory is in the write state or the non-read and non-write state, the impedance of the DQ is controlled by using the fourth impedance control signal and the fifth impedance control signal. (2) When the semiconductor memory is in the read state or the preset test state, the impedance of the DQ is controlled by using the third impedance control signal and the fifth impedance control signal.

In this way, by merging the signal control strategy of the DQ in the PODTM into the signal control strategy of the read-related attribute, the impedance control of the PODTM is realized.

It should be understood that the Write function only involves controlling of the pull-up impedance (as the termination impedance), and the Read function involves both controlling of the pull-up impedance and of the pull-down impedance. Since the DM only enables the Write function but not the Read function, the DM only involves the control signal of the pull-up impedance, and the control signal of the pull-down impedance of the DM will be set to a fixed level signal to disable the pull-down impedance function. In addition, since the DQ supports both the Write function and the Read function, the DQ may involve the control signal of the pull-up impedance and the control signal of the pull-down impedance.

Therefore, the read-related attribute of the DM only involves one signal (the first non-test state control signal or the second impedance control signal), which is configured to control the pull-up impedance. The read-related attribute of the DQ involves two signals (the third non-test state control signal and the fifth impedance control signal, or the fourth impedance control signal and the fifth impedance control signal), which respectively control the pull-up impedance and the pull-down impedance.

Embodiments of the present disclosure provide a control method. When the semiconductor memory is in the preset test mode, the first MR and the second MR related to the DQ are allowed to directly define the impedance of the DM. For the DM, there is no need to add definition of the output driver state and the related control circuit for the preset test mode to ensure that the preset test mode is adapted to the DM. The impedance of the DM may be tested in the preset test mode to avoid circuit processing errors.

Figure 3:
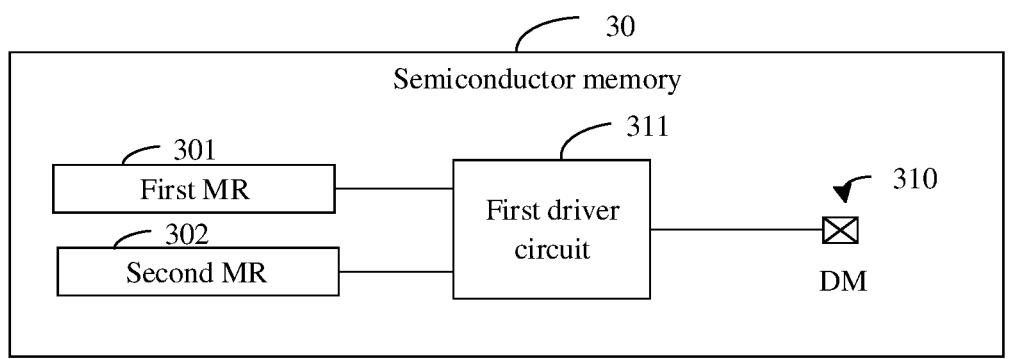
FIG. 3 is a schematic structural diagram of a semiconductor memory according to an embodiment of the present disclosure.

In an embodiment of the present disclosure, referring to FIG. 3, which shows a schematic structural diagram of a semiconductor memory 30 according to an embodiment of the present disclosure. As shown in FIG. 3, the semiconductor memory 30 includes a first MR 301, a second MR 302, a DM 310 and a first driver circuit 311, and the first driver circuit 311 is connected with the first MR 301, the second MR 302 and the DM 310 respectively.

The DM 310 is configured to receive an input mask signal of write data.

The first driver circuit 311 is configured to, when the semiconductor memory 30 is in a preset test mode, control, in response to the DM 310 being selected as a test object, the impedance of the DM 310 to be a first impedance parameter according to the first MR 301, or, control, in response to the DM 310 is being selected as the test object, the impedance of the DM 310 to be the second impedance parameter according to the second MR 302.

Here, the semiconductor memory 30 further includes at least one DQ, the DQ is configured to receive or output data, the first MR 301 is configured to indicate that the impedance of the at least one DQ in an output driver state is the first impedance parameter, and the second MR 302 is configured to indicate that the impedance of the at least one DQ in a termination state is the second impedance parameter.

In this way, when the semiconductor memory 30 is in the preset test mode, the first MR 301 and the second MR 302 are allowed to directly define the impedance of the DM 310. For the DM 310, there is no need to add definition of the output driver state and a related control circuit for the preset test mode to ensure that the preset test mode is adapted to the DM 310. The impedance of the DM 310 may be tested in the preset test mode to avoid circuit processing errors.

Figure 4A:
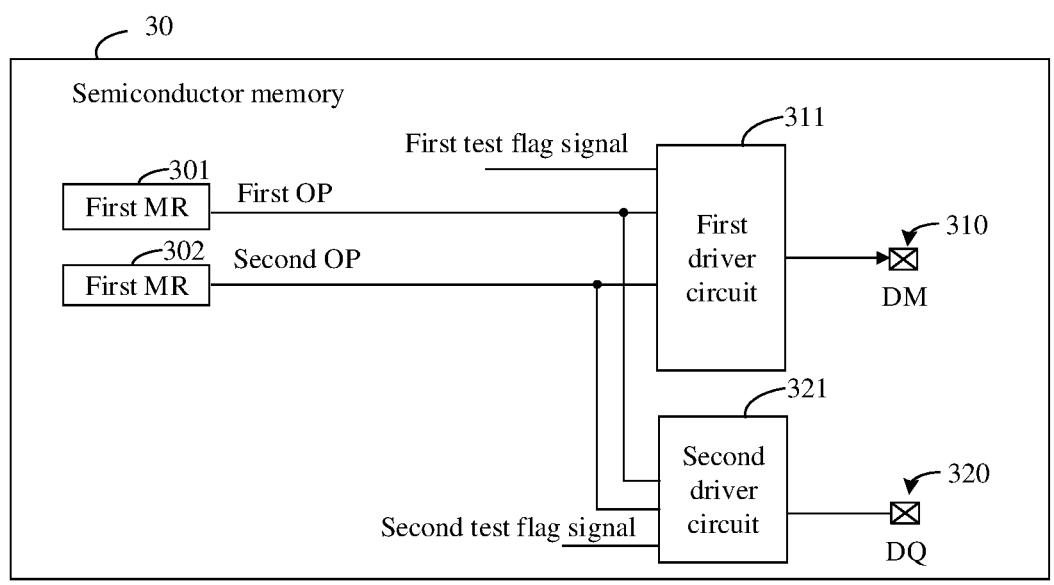
FIG. 4A is a local schematic structural diagram I of a semiconductor memory according to an embodiment of the present disclosure.

In some embodiments, as shown in FIG. 4A, the semiconductor memory 30 further includes at least one second driver circuit 321, and each second driver circuit 321 is connected with the first MR 301, the second MR 302 and one DQ 320.

The second driver circuit 321 is configured to, when the semiconductor memory 30 is in the preset test mode, control, in response to the corresponding DQ 320 being selected as the test object, the impedance of the DQ 320 to be the first impedance parameter through the first MR 301; or, control, in response to the corresponding DQ 320 not being selected the test object, the impedance of the DQ 320 to be the second impedance parameter through the second MR 302.

It should be understood that only one DQ 320 is shown in FIG. 4A for illustration, and there are actually more DQs in the semiconductor memory 30. The embodiments of the present disclosure do not limit the numbers of the DMs 310 and the DQs 320.

It is to be noted that the preset test mode may be a PODTM, which allows a host to test the pull-up impedance of the DM or the DQ.

Figure 4B:
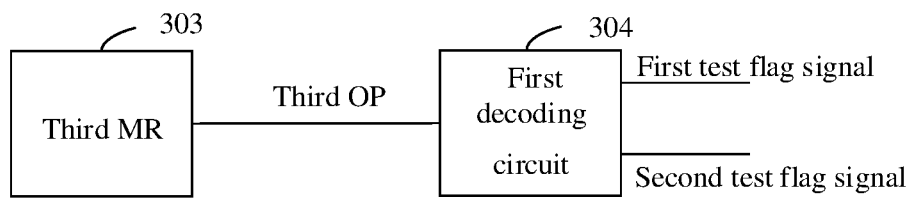
FIG. 4B is a local schematic structural diagram II of a semiconductor memory according to an embodiment of the present disclosure.

In some embodiments, as shown in FIG. 4B, the semiconductor memory 30 further includes a third MR 303 and a first decoding circuit 304.

The first MR 301 is configured to store and output a first Operand (OP).

The second MR 302 is configured to store and output a second OP.

The third MR 303 is configured to store and output a third OP. Herein, the third OP is configured to indicate whether the semiconductor memory 30 enters the preset test mode.

The first decoding circuit 304 is configured to receive the third OP, decode the third OP and output a first test flag signal. Herein, the first test flag signal is configured to indicate whether the DM 310 is the test object.

The first driver circuit 311 is further configured to receive the first test flag signal, the first OP and the second OP; and select, according to the first test flag signal, one of the first OP and the second OP to control the impedance of the DM 310 in a case that the semiconductor memory 30 enters the preset test mode.

In some embodiments, as shown in FIG. 4B, the first decoding circuit 304 is further configured to decode the third OP and output at least one second test flag signal. Herein, one second test flag signal is configured to indicate whether one DQ is a test object.

The second driver circuit 321 is further configured to receive a corresponding second test flag signal, the first OP and the second OP; and select, according to the second test flag signal, one of the first OP and the second OP to control the impedance of the DQ 320, in the case that the semiconductor memory 30 enters the preset test mode.

It is to be noted that the first test flag signal is an internal flag signal introduced for the DM 310 to indicate whether the DM 310 is the test object in the PODTM. The second test flag signal is an internal flag signal introduced for the DQ 320 to indicate whether the DQ 320 is the test object in the PODTM. Both the first test flag signal and the second test flag signal are obtained by decoding according to the third OP.

In this way, in the embodiment of the present disclosure, it is determined whether the semiconductor memory 30 enters the PODTM through the third OP in the third MR, and in the case of entering the PODTM, the test object is selected from the DM and the at least one data DQ. Then, the impedance of the selected test object is controlled to be the first impedance parameter (essentially the pull-up output driver impedance) through the first OP in the first MR, and the impedance of the unselected test object is controlled to be the second impedance parameter (essentially the termination impedance) through the second OP in the second MR, so as to obtain the impedance test result of the test object. For the DM, there is no need to add definition of the output driver state and the related control circuit for the preset test mode to ensure that the preset test mode is adapted to the DM. The impedance of the DM may be tested in the preset test mode to avoid the circuit processing errors.

It is to be noted that the standard serial number of the first MR is 5, and the first OP refers to an OP from the second bit to the first bit stored in the first MR, represented as MR5 OP[2:1]. The standard serial number of the second MR is 34, and the second OP refers to an OP from the second bit to the 0th bit stored in the second MR, represented as MR34 OP[2:0]. The standard serial number of the third MR is 61, and the third OP refers to an OP from the $4^{th}$ bit to the $0^{th}$ bit stored in the third MR, represented as MR61 OP[4:0].

Figure 5:
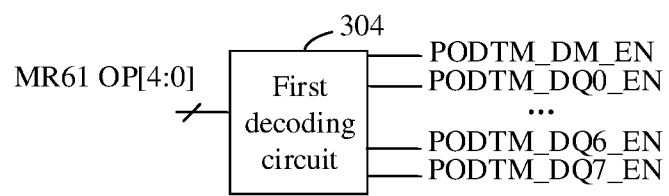
FIG. 5 is a schematic structural diagram of a first decoding circuit according to an embodiment of the present disclosure.

As shown in FIG. 5, taking a 8-bit (X8) semiconductor memory 30 as an example, the first decoding circuit 304 is configured to receive the third OP MR61 OP[4:0], and decode the same to obtain the first test flag signal PODTM_DM_EN, the second test flag signal PODTM_DQ0_EN-PODTM_DQ7_EN. Here, the second test flag signal PODTM_DQ0_EN-PODTM_DQ7_EN is configured to indicate whether the DQs DQ0L0-DQL7 are the test objects in the PODTM. It should be understood that a logic circuit in the first decoding circuit 304 is designed according to the aforementioned Table 1.

The specific structure description of the first driver circuit 311 is exemplarily provided below.

In the embodiment of the present disclosure, the semiconductor memory 30 is further configured to determine a first non-test state control signal, a second impedance control signal and a first calibration signal ZQ1_CODE[N−1:0].

Figure 6:
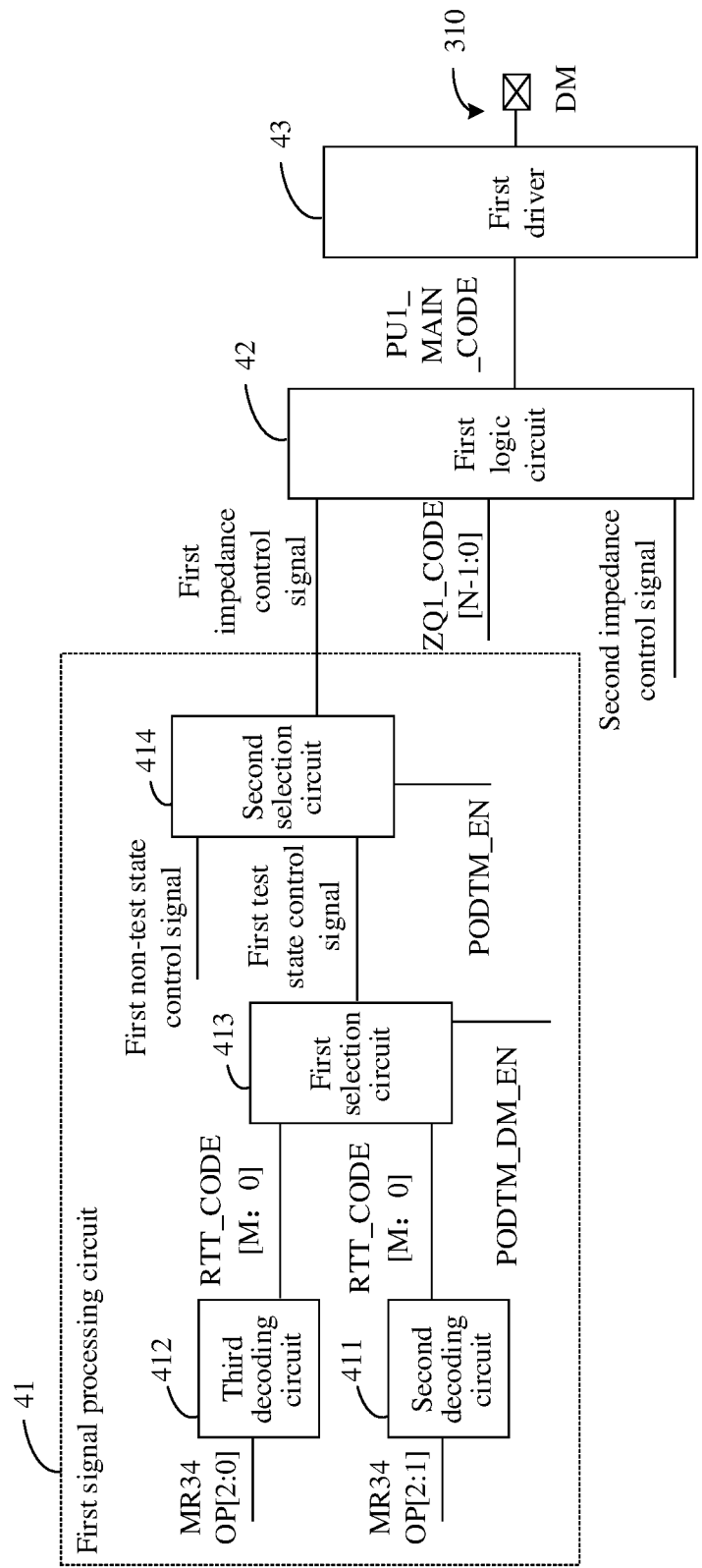
FIG. 6 is a schematic structural diagram of a first driver circuit according to an embodiment of the present disclosure.

As shown in FIG. 6, the first driver circuit 311 may include a first signal processing circuit 41, a first logic circuit 42, and a first driver 43.

The first signal processing circuit 41 is configured to receive the first test flag signal PODTM_DM_EN, the first OP MR5 OP[2:1], the second OP MR34 OP[2:0] and the first non-test state control signal; and output, based on one of the first OP MR5 OP[2:1] and the second OP MR34 OP[2:0], a first impedance control signal according to the first test flag signal PODTM_DM_EN when the semiconductor memory 30 is in the preset test state; or, output, based on the first non-test state control signal, the first impedance control signal when the semiconductor memory 30 is not in the preset test mode.

The first logic circuit 42 is configured to receive the first impedance control signal, the second impedance control signal and the first calibration signal ZQ1_CODE[N−1:0]; and select and logically combine the first impedance control signal, the second impedance control signal and the first calibration signal ZQ1_CODE[N−1:0] to output a first target signal PU1_MAIN_CODE.

The first driver 43 includes a plurality of first impedance circuits and configured to receive the first target signal PU1_MAIN_CODE, and control the plurality of first impedance circuits by using the first target signal PU1_MAIN_CODE, so as to control the impedance of the DM 310.

It should be understood that the DM 310 only supports the Write function, and does not need to output data to the outside. In the termination state, it only involves the level pull-up function but not the level pull-down function, so that the first driver circuit 311 only has the first impedance control signal and the second impedance control signal which are configured to control the level pull-up function, but does not involve signals related to controlling of the level pull-down function. In addition, the pull-up resistance value of each first impedance circuit may be a standard resistance value. However, with changes in environmental parameters such as temperature and voltage in the actual working environment, the resistance value of the first impedance circuit may also change accordingly. Therefore, the first calibration signal ZQ1_CODE[N−1:0] is configured to calibrate the resistance value of each first impedance circuit to the standard resistance value. Here, all the first impedance circuits share the first calibration signal ZQ1_CODE[N−1:0].

It is to be noted that the first impedance control signal and the second impedance control signal respectively correspond to two attributes, that is, a write-related attribute and a read-related attribute. It should be understood that in the non-PODTM, according to the actual working state, one of the first impedance control signal and the second impedance control signal is valid, which is combined with the first calibration signal ZQ1_CODE[N−1:0] to obtain the first target signal PU1_MAIN_CODE. In addition, in the PODTM, the second impedance control signal is invalid, and the first impedance control signal and the first calibration signal ZQ1_CODE[N−1:0] are combined to obtain the first target signal PU1_MAIN_CODE. Here, the valid signal in the first impedance control signal and the second impedance control signal is configured to enable or disable the level pull-up function of the first impedance circuit, and the first calibration signal ZQ1_CODE[N−1:0] is configured to calibrate the resistance value of the first impedance circuit to the standard resistance value when the level pull-up function of the first impedance circuit is enabled.

In some embodiments, as shown in FIG. 6, the first signal processing circuit 41 includes a second decoding circuit 411, a third decoding circuit 412, a first selection circuit 413, and a second selection circuit 414.

The second decoding circuit 411 is configured to receive the first OP MR5 OP[2:1], decode the first OP MR5 OP[2:1] and output a first decoded signal RONpu_CODE[M:0].

The third decoding circuit 412 is configured to receive the second OP MR34 OP[2:0], decode the second OP MR34 OP[2:0] and output a second decoded signal RTT_CODE [M:0].

The first selection circuit 413 is configured to receive the first test flag signal PODTM_DM_EN, the first decoded signal RONpu_CODE[M:0] and the second decoded signal RTT_CODE[M:0]; and select one of the first decoded signal RONpu_CODE[M:0] and the second decoded signal RTT_CODE[M:0] to output a first test state control signal according to the first test flag signal PODTM_DM_EN.

The second selection circuit 414 is configured to receive a test enable signal PODTM_EN, the first test state control signal and the first non-test state control signal; and select one of the first test state control signal and the first non-test state control signal to output the first impedance control signal according to the test enable signal PODTM_EN.

It should be understood that a logic circuit in the second decoding circuit 411 is designed according to the aforementioned Table 2, that is, the first decoded signal is configured to represent a resistance value (the first impedance parameter) of the driver impedance Ron, and a logic circuit in the third decoding circuit 412 is designed according to the aforementioned Table 3, that is, the second decoded signal is configured to represent a resistance value (the second impedance parameter) of the termination impedance RTT. In addition, M is a positive integer, and its specific value needs to be determined according to the actual working scenario.

It is to be noted that the test enable signal PODTM_EN is configured to indicate whether the semiconductor memory is in the preset test mode PODTM, and is also decoded according to a third control code MR61 OP[4:0]. As shown in Table 1 above, when the value of MR61 OP[4:0] is in other combination forms other than 00000B in Table 1, it indicates that the semiconductor memory is in the preset test mode PODTM, and the test enable signal PODTM_EN is in a first level state (for example, logic "1"). When MR61 OP[4:0]=00000B, it indicates that the semiconductor memory is not in the preset test mode PODTM, and the test enable signal PODTM_EN is in a second level state (for example, logic "0"). Or, it may also be understood that if one of the first test flag signal or the second test flag signal is in the first level state, the test enable signal PODTM_EN is in the first level state. If both the first test flag signal and the second test flag signal are in the second level state, the test enable signal PODTM_EN is in the second level state.

For the first driver circuit 311 shown in FIG. 6, according to the different definitions of the first non-test state control signal and the second impedance control signal, there may be two specific implementation modes.

In one implementation mode, the first non-test state control signal is configured to indicate the impedance of the DM in a state other than the preset test state, and the second impedance control signal is configured to indicate the impedance of the DQ in the output driver state. That is, by merging the signal control strategy of the DM in the PODTM into the signal control strategy of the write-related attribute, the impedance control of the PODTM is realized.

Figure 7:
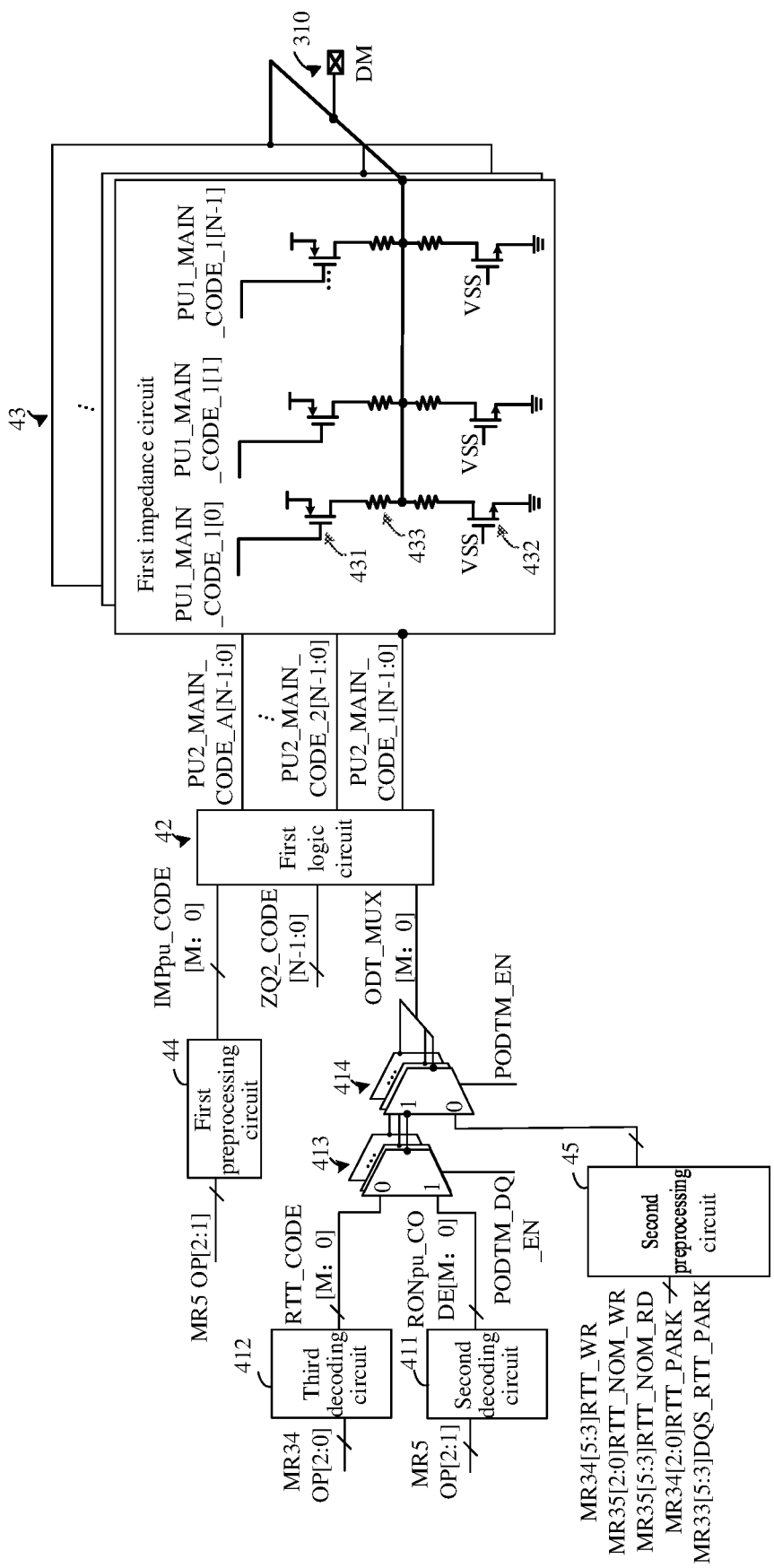
FIG. 7 is a detailed schematic structural diagram I of a first driver circuit according to an embodiment of the present disclosure.

Correspondingly, as shown in FIG. 7, the first impedance control signal is represented by ODT_MUX[M:0], and the second impedance control signal is represented by IMPpu_CODE[M:0]. Particularly, compared with FIG. 6, the first driver circuit 311 in FIG. 7 further includes a first preprocessing circuit 44 and a second preprocessing circuit 45. The first preprocessing circuit 44 is configured to decode the first OP MR5 OP[2:1] to obtain the second impedance control signal IMPpu_CODE[M:0]. The second preprocessing circuit 45 is configured to determine the first non-test state control signal according to MR34[5:3] involving RTT_WR, MR35[2:0] involving RTT_NOM_WR, MR35 [5:3] involving RTT_NOM_RD, MR34[2:0] involving RTT_PARK, and MR33[5:3] involving DQS_RTT_PARK. The specific meanings of the above signals refer to the regulations of DDR5 SPEC, and the signals of the part do not affect the implementation of the non-disclosed embodiments, which will not be described in detail. In addition, in the following description, if the semiconductor memory 30 is in the PODTM, the test enable signal PODTM_EN is logic "1". If the semiconductor memory 30 is not in the PODTM, the test enable signal PODTM_EN is logic "0". If the DM 310 is the test object of the PODTM, the first test flag signal PODTM_DM_EN is logic "1". If the DM 310 is not the test object of the PODTM, the first test flag signal PODTM_DM_EN is logic "0".

The working principle of FIG. 7 is explained below in three working scenarios.

In the working scenario 1, the semiconductor memory 30 enters the PODTM and the DM 310 is the test object. At this time, since the first test flag signal PODTM_DM_EN is logic "1", the first selection circuit 413 outputs the first decoded signal RONpu_CODE[M:0] to obtain the first test state control signal. Since the test enable signal PODTM_EN is logic "1", the second selection circuit 414 outputs the first test state control signal determined by the first selection circuit 413 to obtain the first impedance control signal ODT_MUX[M:0]. As previously described, the second impedance control signal IMPpu_CODE[M:0] in the PODTM is invalid, so that the first logic circuit 42 actually logically combines the first impedance control signal ODT_MUX[M:0] and the first calibration signal ZQ1_CODE[N−1:0] to obtain the first target signal PU1_MAIN_CODE, thereby controlling the impedance of the DM 310. Here, the invalidation of the second impedance control signal IMPpu_CODE[M:0] may be achieved in at least two ways, i.e., adding corresponding signal blocking logic in the first preprocessing circuit 44, or adding corresponding signal blocking logic in the first logic circuit 42.

As can be seen from the above, for the working scenario 1, the impedance of the DM 310 is actually controlled by the first OP MR5 OP[2:1].

In the working scenario 2, the semiconductor memory 30 enters the PODTM and the DM 310 is not the test object. At this time, since the first test flag signal PODTM_DM_EN is logic "0", the first selection circuit 413 outputs the second decoded signal RTT_CODE[M:0] to obtain the first test state control signal. Since the test enable signal PODTM_EN is logic "1", the second selection circuit 414 outputs the first test state control signal determined by the first selection circuit 413 to obtain the first impedance control signal ODT_MUX[M:0]. As previously described, the second impedance control signal IMPpu_CODE[M:0] in the PODTM is invalid, so that the first logic circuit 42 actually logically combines the first impedance control signal ODT_MUX[M:0] and the first calibration signal ZQ1_CODE[N−1:0] to obtain the first target signal PU1_MAIN_CODE, thereby controlling the impedance of the DM 310.

As can be seen from the above, for the working scenario 2, the impedance of the DM 310 is actually controlled by the second OP MR34 OP[2:0].

In the working scenario 3, the semiconductor memory 30 does not enter the PODTM. At this time, since the first test flag signal PODTM_DM_EN is logic "0", the second selection circuit 414 outputs the first test state control signal determined by the second preprocessing circuit 45 to obtain the first impedance control signal ODT_MUX[M:0]. Meanwhile, the first preprocessing circuit 44 outputs the second impedance control signal IMPpu_CODE[M:0]. Since the DM 310 only supports the Write function, the second impedance control signal IMPpu_CODE[M:0] in the non-PODTM is invalid and the first impedance control signal ODT_MUX[M:0] is valid, so that the first logic circuit 42 combines the first impedance control signal ODT_MUX[M:0] and the first calibration signal ZQ1_CODE[N−1:0] to obtain the first target signal PU1_MAIN_CODE, thereby controlling the impedance of the DM 310.

As can be seen from the above, for the working scenario 3, the impedance of the DM 310 is actually controlled by the second preprocessing circuit 45, depending on the actual working state.

In another implementation mode, the first non-test state control signal is configured to indicate the impedance of the DQ in the output driver state, and the second impedance control signal is configured to indicate the impedance of the DR other than the preset test state. That is, by merging the signal control strategy of the DR in the PODTM into the signal control strategy of the read-related attribute, the impedance control of the PODTM is realized.

Figure 8:
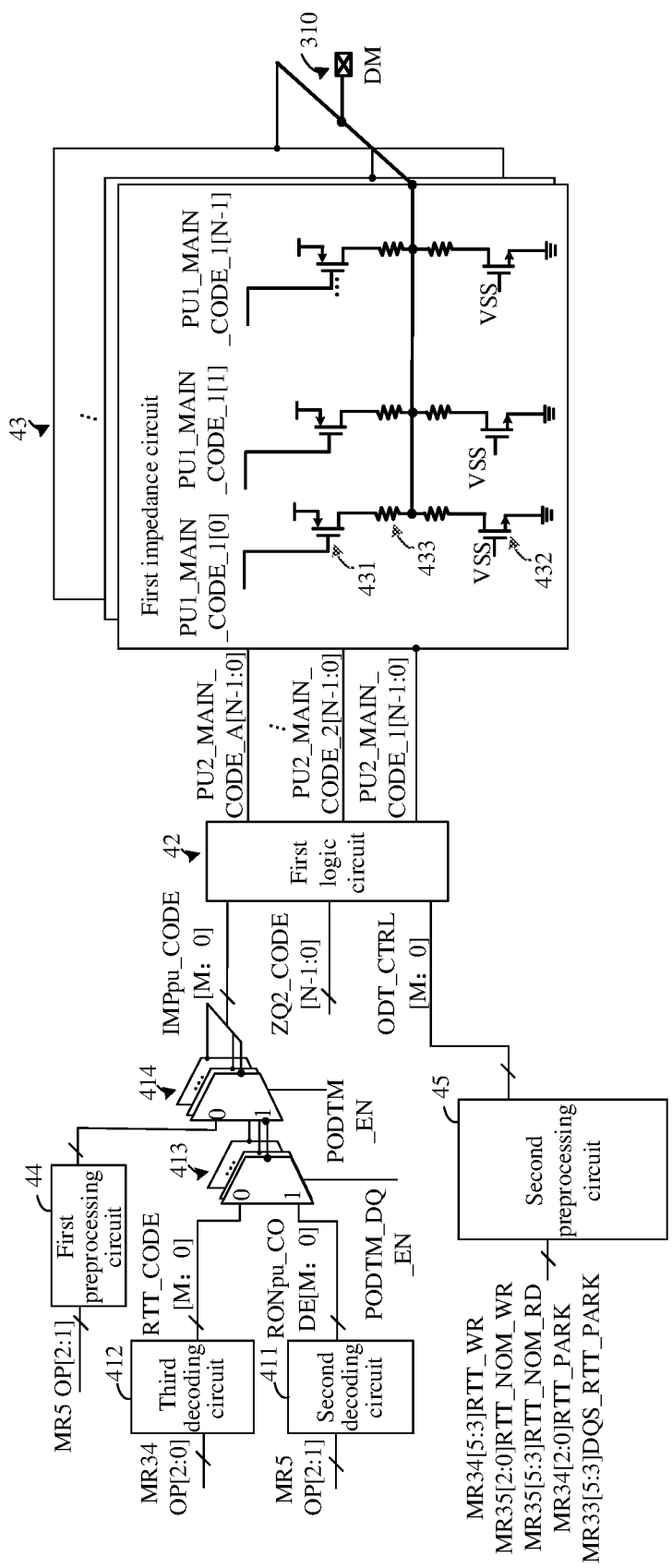
FIG. 8 is a detailed schematic structural diagram II of a first driver circuit according to an embodiment of the present disclosure.

Correspondingly, as shown in FIG. 8, the first impedance control signal is represented by IMPpu_CODE[M:0], and the second impedance control signal is represented by ODT_CTRL[M:0]. Particularly, compared with FIG. 6, the semiconductor memory 30 in FIG. 8 also includes the first preprocessing circuit 44 and the second preprocessing circuit 45. The first preprocessing circuit 44 is configured to decode the first OP MR5 OP[2:1] to obtain the first non-test state control signal. The second preprocessing circuit 45 is configured to determine the second non-test state control signal according to MR34[5:3] involving RTT_WR, MR35[2:0] involving RTT_NOM_WR, MR35[5:3] involving RTT_NOM_RD, MR34[2:0] involving RTT_PARK, and MR33[5:3] involving DQS_RTT_PARK.

Similarly, the working principle of FIG. 8 is explained below in three working scenarios.

In the working scenario 1, the semiconductor memory 30 enters the PODTM and the DM 310 is the test object. At this time, since the first test flag signal PODTM_DM_EN is logic "1", the first selection circuit 413 outputs the first decoded signal RONpu_CODE[M:0] to obtain the first test state control signal. Since the test enable signal PODTM_EN is logic "1", the second selection circuit 414 outputs the first test state control signal determined by the first selection circuit 413 to obtain the first impedance control signal IMPpu_CODE[M:0]. As previously described, the second impedance control signal ODT_CTRL[M:0] in the PODTM is invalid, so that the first logic circuit 42 actually logically combines the first impedance control signal IMPpu_CODE[M:0] and the first calibration signal ZQ1_CODE[N−1:0] to obtain the first target signal PU1_MAIN_CODE, thereby controlling the impedance of the DM 310.

In this way, for the working scenario 1, the impedance of the DM 310 is still controlled by the first OP MR5 OP[2:1].

In the working scenario 2, the semiconductor memory 30 enters the PODTM and the DM 310 is not the test object. At this time, since the first test flag signal PODTM_DM_EN is logic "0", the first selection circuit 413 outputs the second decoded signal RTT_CODE[M:0] to obtain the first test state control signal. Since the test enable signal PODTM_EN is logic "1", the second selection circuit 414 outputs the first test state control signal determined by the first selection circuit 413 to obtain the first impedance control signal IMPpu_CODE[M:0]. As previously described, the second impedance control signal ODT_CTRL in the PODTM is invalid, so that the first logic circuit 42 actually logically combines the first impedance control signal IMPpu_CODE[M:0] and the first calibration signal ZQ1_CODE[N−1:0] to obtain the first target signal PU1_MAIN_CODE, thereby controlling the impedance of the DM 310.

In this way, for the working scenario 2, the impedance of the DM 310 is still controlled by the second MR34 OP[2:0].

In the working scenario 3, the semiconductor memory 30 does not enter the PODTM. At this time, since the first test flag signal PODTM_EN is logic "0", the second selection circuit 414 outputs the first non-test state control signal determined by the first preprocessing circuit 44 to obtain the first impedance control signal IMPpu_CODE[M:0]. Meanwhile, the second preprocessing circuit 45 outputs the second impedance control signal ODT_CTRL[M:0]. Since the DM only supports the Write function, the first impedance control signal IMPpu_CODE[M:0] in the non-PODTM is invalid and the second impedance control signal ODT_CTRL[M:0] is valid, so the first logic circuit 42 combines the second impedance control signal ODT_CTRL[M:0] and the first calibration signal ZQ1_CODE[N−1:0] to obtain the first target signal PU1_MAIN_CODE, thereby controlling the impedance of the DM 310.

In this way, for the working scenario 3, the impedance of the DM 310 is also controlled by the second preprocessing circuit 45, depending on the actual working state.

It is also to be noted that in FIG. 7 and FIG. 8, the "/" symbol flagged on a signal path is configured to indicate that there are a plurality of signal paths actually, and only one is drawn for illustration. In other words, each signal in MR34 OP[2:0], MR5 OP[2:1], RONpu_CODE[M:0], RTT_CODE [M:0], IMPpu_CODE[M:0], ZQ1_CODE[N−1:0], ODT_C-TRL[M:0], ODT_MUX[M:0], and PU1_MAIN_CODE includes a plurality of sub-signals, and each sub-signal has its own signal path.

The signal processing process in the first driver circuit 311 will be described below with reference to FIG. 7 or FIG. 8.

In some embodiments, as shown in FIG. 7 or FIG. 8, each of the first decoded signal RONpu_CODE[M:0], the second decoded signal RTT_CODE[M:0], the first test state control signal, the first non-test state control signal and the first impedance control signal includes (M+1) bits of sub-signals, represented as [M:0]. The first selection circuit 413 includes (M+1) first data selectors, and the second selection circuit 414 includes (M+1) second data selectors. Herein, the input of one of the first data selectors respectively receives a 1-bit sub-signal of the first decoded signal RONpu_CODE[M:0] and a 1-bit sub-signal of the second decoded signal RTT_CODE[M:0], the output of one of the first data selectors is configured to output a 1-bit sub-signal of the first test state control signal, and the control ends of all the first data selectors receive the first test flag signal PODTM_DM_EN. The input of one of the second data selectors receives the 1-bit sub-signal of the first test state control signal and a 1-bit sub-signal of the first non-test state control signal, the output of one of the second data selectors is configured to output a 1-bit sub-signal of the first impedance control signal, and the control ends of all the second data selectors receive the test enable signal. Herein, M is a positive integer.

It is to be noted that the first test state control signal is represented as the first test state control signal [M:0], the first non-test state control signal is represented as the first non-test state control signal [M:0], and the first impedance control signal is represented as the first impedance control signal [M:0]. In this way, the first one of the first data selectors receives RONpu_CODE[0], RTT_CODE[0] and PODTM_DM_EN respectively, and selects one of RONpu_CODE[0] and RTT_CODE[0] to output the first test state control signal [0] according to PODTM_DM_EN. The first one of the second data selectors receives the first test state control signal [0], the first non-test state control signal [0] and PODTM_EN respectively, and selects one of the first test state control signal [0] and the first non-test state control signal [0] to output the first impedance control signal [0] according to PODTM_EN. The other ones may be understood with reference to the above.

In some embodiments, the second impedance control signal includes (M+1) bits of sub-signals, and the first calibration signal ZQ1_CODE[N−1:0] includes N bits of sub-signals. The first target signal includes A group of sub-signals, and each group of sub-signals includes N bits of sub-signals. The first group of signals in the first target signal are represented as PU1_MAIN_CODE 1[N−1:0], the second group of signals in the first target signal are represented as P PU1_MAIN_CODE 2[N−1:0], and the A group of signals in the first target signal are represented as PU1_MAIN_CODE A[N−1:0].

The first driver 43 includes A first impedance circuits, and each first impedance circuit is configured to receive a group of sub-signals in the first target signal PU1_MAIN_CODE. Herein, as shown in FIG. 7 or FIG. 8, the first logic circuit 42 is specifically configured to determine whether the level pull-up function of the at least one first impedance circuit is enabled according to the first impedance control signal and the second impedance control signal; and determine, in a case that the level pull-up function of the $a^{th}$ first impedance circuit is enabled, the level state of the $a^{th}$ group of sub-signals in the first target signal PU1_MAIN_CODE according to the first calibration signal, so as to control the resistance value of the $a^{th}$ first impedance circuit to be the standard resistance value; or, determine, in a case that the level pull-up function of the $a^{th}$ first impedance circuit is disabled, that the $a^{th}$ group of sub-signals in the first target signal PU1_MAIN_CODE are in the first level state. Herein, a, N, and A are all integers, a is less than or equal to A, and (M+1) is less than or equal to A.

It should be understood that the plurality of first impedance circuits are in a parallel state, and each first impedance circuit may provide a standard resistance value RZQ. In this way, if the pull-up impedance of the DM 310 needs to be adjusted to RZQ/2, the level pull-up functions of the two first impedance circuits are enabled, and the level pull-up functions of the remaining first impedance circuits are disabled. If the pull-up impedance of the DM 310 needs to be adjusted to RZQ/3, the level pull-up functions of the three first impedance circuits are enabled, and the level pull-up functions of the remaining first impedance circuits are disabled. Other situations may be understood by reference.

It should be understood that for the first logic circuit 42, there is only one valid signal between the first impedance control signal and the second impedance control signal. In a case that M+1 is equal to or less than A, the 1-bit sub-signal in the valid signal controls whether the level pull-up function of one or more first impedance circuits is enabled.

Exemplarily, in a case that M+1=A=7, assuming that the valid signal in the first impedance control signal and the second impedance control signal is IMPpu_CODE[6:0], then IMPpu_CODE[0] controls the first impedance control signal, IMPpu_CODE[1] controls the second first impedance circuit IMPpu_CODE[6] controls the seventh first impedance circuit. Specifically, assuming that IMPpu_CODE[6:0]=1111111, the level values of each groups of sub-signals (Seven groups in total) in the first target signal are the same as the level value of the first calibration signal, so that the pull-up resistance values of the seven first impedance circuits are all RZQ, and the pull-up resistance of the DM 310 is RZQ/7. Assuming that IMPpu_CODE[6:0]=1111000, the level values of the first group of sub-signals to the third group of sub-signals in the first target signal are in the first level state, and the level values of each group of sub-signals in the fourth group of sub-signals to the seventh group of sub-signals are all correspondingly the same as the level value of the first calibration signal, so that the first impedance circuit to the third first impedance circuit are all disconnected. The pull-up resistance values of the fourth first impedance circuit to the seventh first impedance circuit are all RZQ, so that the pull-up impedance of the DM 310 is RZQ/4. Other situations may be understood by reference.

Exemplarily, in a case that M+1=4 and A=7, assuming that the valid signal in the first impedance control signal and the second impedance control signal is IMPpu_CODE[3:0], IMPpu_CODE[0] controls the first first impedance control signal, IMPpu_CODE[1] controls the second first impedance circuit and the third first impedance circuit, IMPpu_CODE[2] controls the fourth first impedance circuit and the fifth impedance circuit, and IMPpu_CODE[3] controls the sixth first impedance circuit and the seventh impedance circuit. Specifically, assuming that IMPpu_CODE[3:0]=1111, the level values of each group of sub-signals in the first target signal are the same as the level value of the first calibration signal, so that the pull-up resistance values of the seven first impedance circuits are all RZQ, and the pull-up resistance of the DM 310 is RZQ/7. Assuming that IMPpu_CODE[3:0]=1100, the level values of the first group of sub-signals to the third group of sub-signals in the first target signal are in the first level state, and the level values of each group of sub-signals in the fourth group of sub-signals to the seventh group of sub-signals are all correspondingly the same as the level value of the first calibration signal, so that the first impedance circuit to the third first impedance circuit are all disconnected. The pull-up resistance values of the fourth first impedance circuit to the seventh first impedance circuit are all RZQ, so that the pull-up impedance of the DM 310 is RZQ/4. Other situations may be understood by reference.

On this basis, if the level pull-up function of a certain first impedance circuit is enabled, the pull-up resistance value of the first impedance circuit is calibrated to the standard resistance value by using the first calibration signal, otherwise if the level pull-up function of the first impedance circuit is disabled, the related circuit of the first impedance circuit is disconnected by using a fixed signal in the first level state.

In some embodiments, as shown in FIG. 7 or FIG. 8, each first impedance circuit includes N first switch transistors (for example, the first switch transistor 431 in FIG. 7 or FIG. 8), N second switch transistors (for example, the second switch transistor 432 in FIG. 7 or FIG. 8) and 2N first resistors (for example, the first resistor 433 in FIG. 7 or FIG. 8). The control end of the $n^{th}$ first switch transistor in the $a^{th}$ first impedance circuit is connected with the $n^{th}$ sub-signal in the $a^{th}$ group of sub-signals in the first target signal, the first end of one of the first switch transistors is connected with the first end of one of the first resistors, and the second end of one of the first switch transistors is connected with a power signal. The control end of one of the second switch transistors is connected with a ground signal VSS, the first end of one of the second switch transistor is connected with the ground signal VSS, the second end of one of the second switch transistor is connected with the first end of one of the first resistors, and the second ends of the 2N first resistors are all connected with the DM. Herein, n is less than or equal to N. Particularly, the signal connected to the control end of the second switch transistor needs to be determined according to the specific circuit logic, and is mainly configured to control the second switch transistor to be in a turn-off state.

It is to be noted that in FIG. 7 or FIG. 8, taking the first impedance circuit as an example, the first impedance circuit is configured to receive the first group of sub-signals PU1_MAIN_CODE_1[N−1:0] in the first target signal. PU1_MAIN_CODE_1[N−1:0] includes N sub-signals of PU1_MAIN_CODE_1 [0], PU1_MAIN_CODE_1 [1] to PU1_MAIN_CODE_1[N−1]. Each sub-signal is configured to control the working state of one of the first switch transistors correspondingly, so as to control the first impedance circuit to perform the level pull-up function with the standard resistance value or not perform the level pull-up function.

In addition, in FIG. 7 or FIG. 8, the first impedance circuit shows the three first switch transistors (only one first switch transistor 431 is numbered), three second switch transistors (only one second switch transistor 432 is numbered), and six first resistors (only one first resistor 433 is numbered), but in actual scenarios, the number of the first switch transistors/second switch transistors/first resistors may all be more or less.

It should be understood that the DM 310 only supports the data write function and provides the termination impedance, so that it is not necessary to perform the level pull-down function. Therefore, the first ends of all the second switch transistors are connected with the ground signal VSS, that is, all the second switch transistors are turned off.

The specific structure description of the second driver circuit 321 is exemplarily provided below. It should be understood that although some signals in the second driver circuit 321 and some signals in the first driver circuit 311 have different names, the source electrodes and waveforms of the signals are basically the same, so the same English names are used.

In the embodiment of the present disclosure, the semiconductor memory 30 is further configured to determine a third non-test state control signal, a fourth impedance control signal, a fifth impedance control signal, a second calibration signal ZQ2_CODE[N−1:0] and a third calibration signal ZQ3_CODE[N−1:0].

Figure 9:
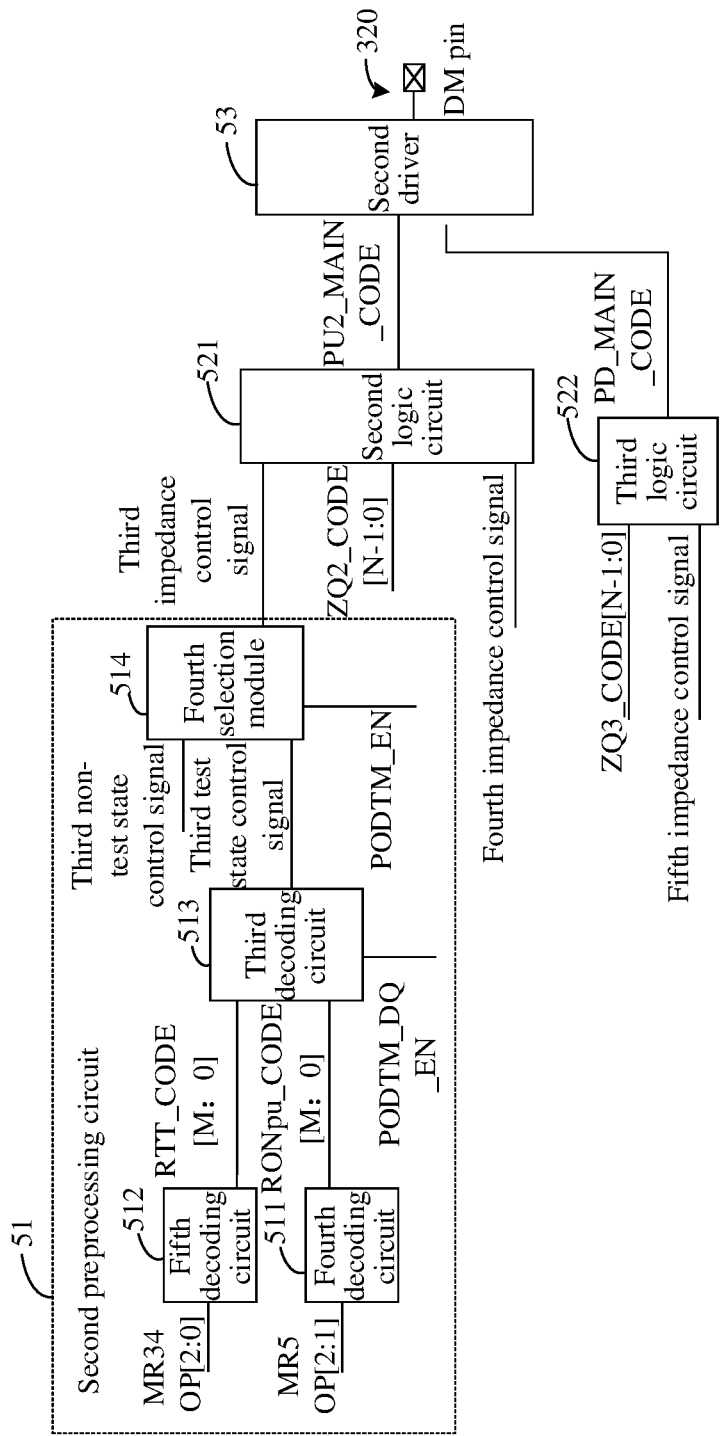
FIG. 9 is a schematic structural diagram of a second driver circuit according to an embodiment of the present disclosure.

As shown in FIG. 9, the second driver circuit 321 may include a second signal processing circuit 51, a second logic circuit 521, a third logic circuit 522, and a second driver 53.

The second signal processing circuit 51 is configured to receive the second test flag signal PODTM_DQ_EN (for example, aforementioned PODTM_DQ0_EN, or PODTM_DQ1_EN . . . or PODTM_DQ7_EN), the first OP MR5 OP[2:1], the second OP MR34 OP[2:0] and the third non-test state control signal; and output, based on one of the first OP MR5 OP[2:1] and the second OP MR34 OP[2:0], a third impedance control signal according to the second test flag signal PODTM_DQ_EN when the semiconductor memory 30 is in the preset test mode; or, output, based on the third non-test state control signal, the third impedance control signal when the semiconductor memory 30 is not in the preset test mode.

The second logic circuit 521 is configured to receive the third impedance control signal, the fourth impedance control signal and the second calibration signal ZQ2_CODE[N−1:0]; and select and logically combine the fourth impedance control signal and the second calibration signal ZQ2_CODE[N−1:0] to output a second target signal PU2_MAIN_CODE.

The third logic circuit 522 is configured to receive the fifth impedance control signal and the third calibration signal ZQ3_CODE[N−1:0]; and logically combine the fifth impedance control signal and the third calibration signal ZQ3_CODE[N−1:0] to output a third target signal PD_MAIN_CODE.

The second driver 53 includes a plurality of second impedance circuits and is configured to receive the second target signal PU2_MAIN_CODE and the third target signal PD_MAIN_CODE; and control the plurality of second impedance circuits by using the second target signal PU2_MAIN_CODE and the third target signal PD_MAIN_CODE, so as to control the impedance of the corresponding DM 320.

It is to be noted that each DQ 320 corresponds to the respective second driver circuit 321, and the embodiment of the present disclosure only takes one second driver circuit 321 as an example for explanation.

It should be understood that the DQ 320 supports the Write function and the Read function, and involves both the level pull-up function and the level pull-down function. Therefore, there are not only the third impedance control signal and the third impedance control signal which are configured to control the level pull-up function in the second driver circuit 321, but also the fifth impedance control signal configured to control the level pull-down function.

It is to be noted that the second calibration signal ZQ2_CODE[N−1:0] is configured calibrate the pull-up resistance value, that is, the second calibration signal ZQ2_CODE[N−1:0] is configured to calibrate the pull-up resistance value of each second impedance circuit to the standard resistance value. The third calibration signal ZQ3_CODE[N−1:0] is configured to calibrate the pull-down resistance value, that is, the third calibration signal ZQ3_CODE[N−1:0] is configured to calibrate the pull-down resistance value of each second impedance circuit to the standard resistance value.

In addition, since the first calibration signal ZQ1_CODE[N−1:0] and the second calibration signal ZQ2_CODE[N−1:0] are both configured to calibrate the pull-up resistance value, in some embodiments, it may be considered that the deviations of the first impedance circuit and the second impedance circuit are within an allowable error range, so that the first calibration signal ZQ1_CODE[N−1:0] and the second calibration signal ZQ2_CODE[N−1:0] may be the same signal.

It is also to be noted that for the second driver circuit 321, the valid signal in the third impedance control signal and the fourth impedance control signal is combined with the second calibration signal ZQ2_CODE[N−1:0] through the second logic circuit 521, so as to form the second target signal PU2_MAIN_CODE configured to control the level pull-up function of the second impedance circuit. The circuit structure and signal processing process of this part of the circuit may be correspondingly understood with reference to the first driver circuit 311, which is not repeated here.

In addition, the second driver circuit 321 also combines the fifth impedance control signal and the third calibration signal ZQ3_CODE[N−1:0] through the third logic circuit 522, so as to form the third target signal PD_MAIN_CODE configured to control the level pull-down function of the second impedance circuit.

In some embodiments, as shown in FIG. 9, the second signal processing circuit 51 may include a fourth decoding circuit 511, a fifth decoding circuit 512, a third selection circuit 513, and a fourth selection circuit 514.

The fourth decoding circuit 511 is configured to receive the first OP MR5 OP[2:1], decode the first OP MR5 OP[2:1] and output a third decoded signal RONpu_CODE[M:0].

The fifth decoding circuit 512 is configured to receive the second OP MR34 OP[2:0], decode the second OP MR34 OP[2:0] and output a fourth decoded signal RTT_CODE[M:0].

The third selection circuit 513 is configured to receive the second test flag signal PODTM_DQ_EN, the third decoded signal RONpu_CODE[M:0] and the fourth decoded signal RTT_CODE[M:0]; and select one of the third decoded signal RONpu_CODE[M:0] and the fourth decoded signal RTT_CODE[M:0] to output a third test state control signal according to the second test flag signal.

The fourth selection circuit 514 is configured to receive the test enable signal PODTM_EN, the third test state control signal and the third non-test state control signal; and select one of the third test state control signal and the third non-test state control signal to output the third impedance control signal according to the test enable signal PODTM_EN. Herein, the test enable signal PODTM_EN is configured to indicate whether the semiconductor memory 30 is in the preset test mode.

For the second driver circuit 321 shown in FIG. 9, according to the different definitions of the third non-test state control signal and the fourth impedance control signal, there may be two specific implementation modes.

In one embodiment, the third non-test state control signal is configured to indicate the impedance of the corresponding DQ in a termination state, and the fourth impedance control signal and the fifth impedance control signal are jointly configured to indicate the impedance of the corresponding DQ in the output driver state. That is, by merging the signal control strategy of the DQ in the PODTM into the signal control strategy of the write-related attribute, the impedance control of the PODTM is realized.

Figure 10:
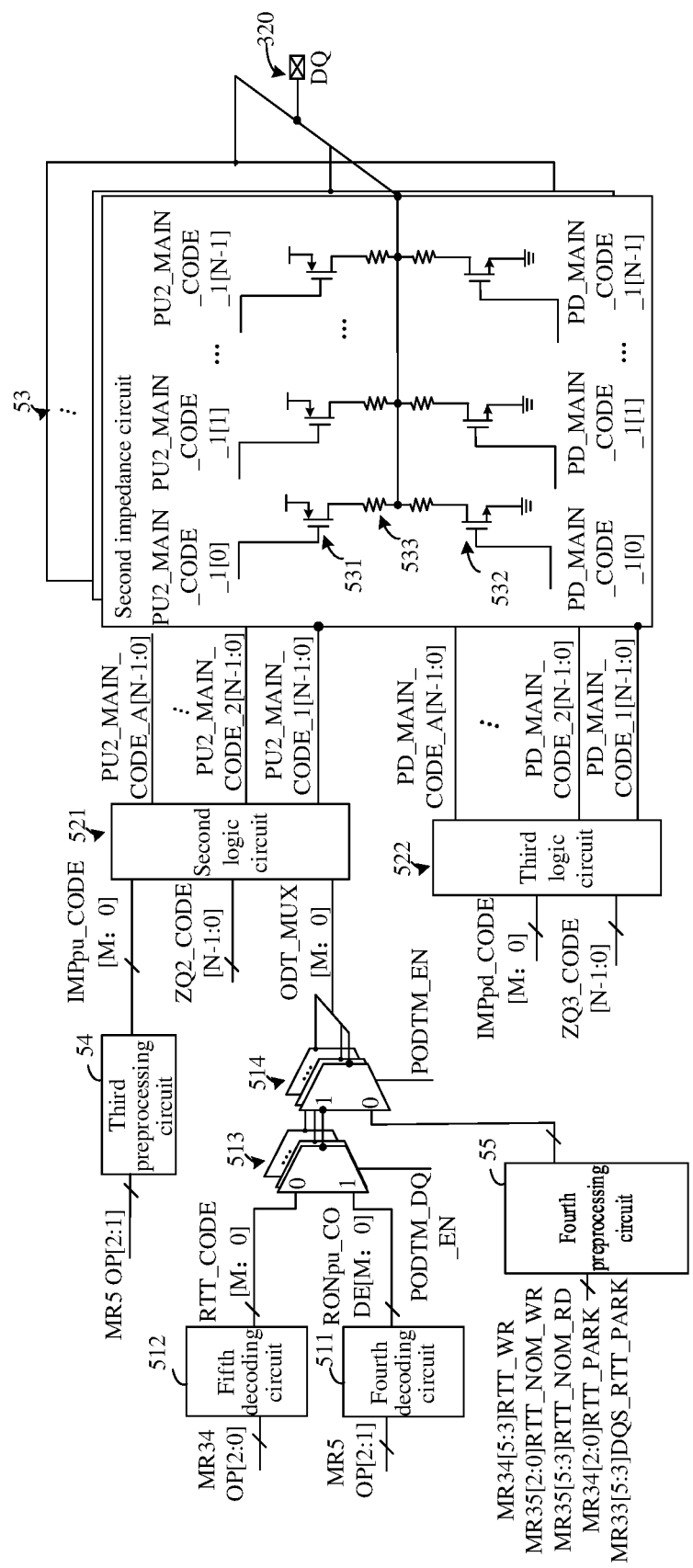
FIG. 10 is a detailed schematic structural diagram I of a second driver circuit according to an embodiment of the present disclosure.

Correspondingly, as shown in FIG. 10, the third impedance control signal is represented by ODT_MUX[M:0], the fourth impedance control signal is represented by IMPpu_CODE[M:0], and the fifth impedance control signal is represented by IMPpd_CODE[M:0]. Particularly, compared with FIG. 9, the semiconductor memory 30 in FIG. 10 further includes a third preprocessing circuit 54 and a fourth preprocessing circuit 55. The third preprocessing circuit 54 is configured to decode the first OP MR5 OP[2:1] to obtain the fourth impedance control signal IMPpu_CODE[M:0]. The fourth preprocessing circuit 55 is configured to determine the third non-test state control signal according to MR34[5:3] involving RTT_WR, MR35[2:0] involving RTT_NOM_WR, MR35[5:3] involving RTT_NOM_RD, MR34[2:0] involving RTT_PARK, and MR33[5:3] involving DQS_RTT_PARK. In addition, in the following description, if the semiconductor memory 30 is in the PODTM, the test enable signal PODTM_EN is logic "1". If the semiconductor memory 30 is not in the PODTM, the test enable signal PODTM_EN is logic "0". If the corresponding DQ 320 is the test object of the PODTM, the corresponding first test flag signal PODTM_DQ_EN is logic "1". If the DQ 320 is not the test object of the PODTM, the corresponding first test flag signal PODTM_DQ_EN is logic "0".

The working principle of the second driver circuit 321 in FIG. 10 is substantially the same as that of the first driver circuit 311 in FIG. 7, which may be understood with reference to the foregoing description of FIG. 7 and may not repeated in this embodiment of the present disclosure. In addition, the second driver circuit 321 in FIG. 10 also has an additional control part for the level pull-down impedance, that is, the third logic circuit 522, and its signal processing principle may refer to the following description. It should be understood that since the DQ 320 supports the Write function and the Read function, in the non-PODTM mode, it is necessary to determine that the third impedance control signal or the fourth impedance control signal is valid according to the actual work requirements, and then the valid signal and the second impedance control signal ZQ2_CODE[M:0] are logically combined to obtain the second target signal PU2_MAIN_CODE.

In another embodiment, the third non-test state control signal and the fifth non-test state control signal are jointly configured to indicate the impedance of the corresponding DQ in the output driver state, and the fourth impedance control signal is configured to indicate the impedance of the corresponding DQ in the termination state. That is, by merging the signal control strategy of the DQ in the PODTM into the signal control strategy of the read-related attribute, the impedance control of the PODTM is realized.

Figure 11:
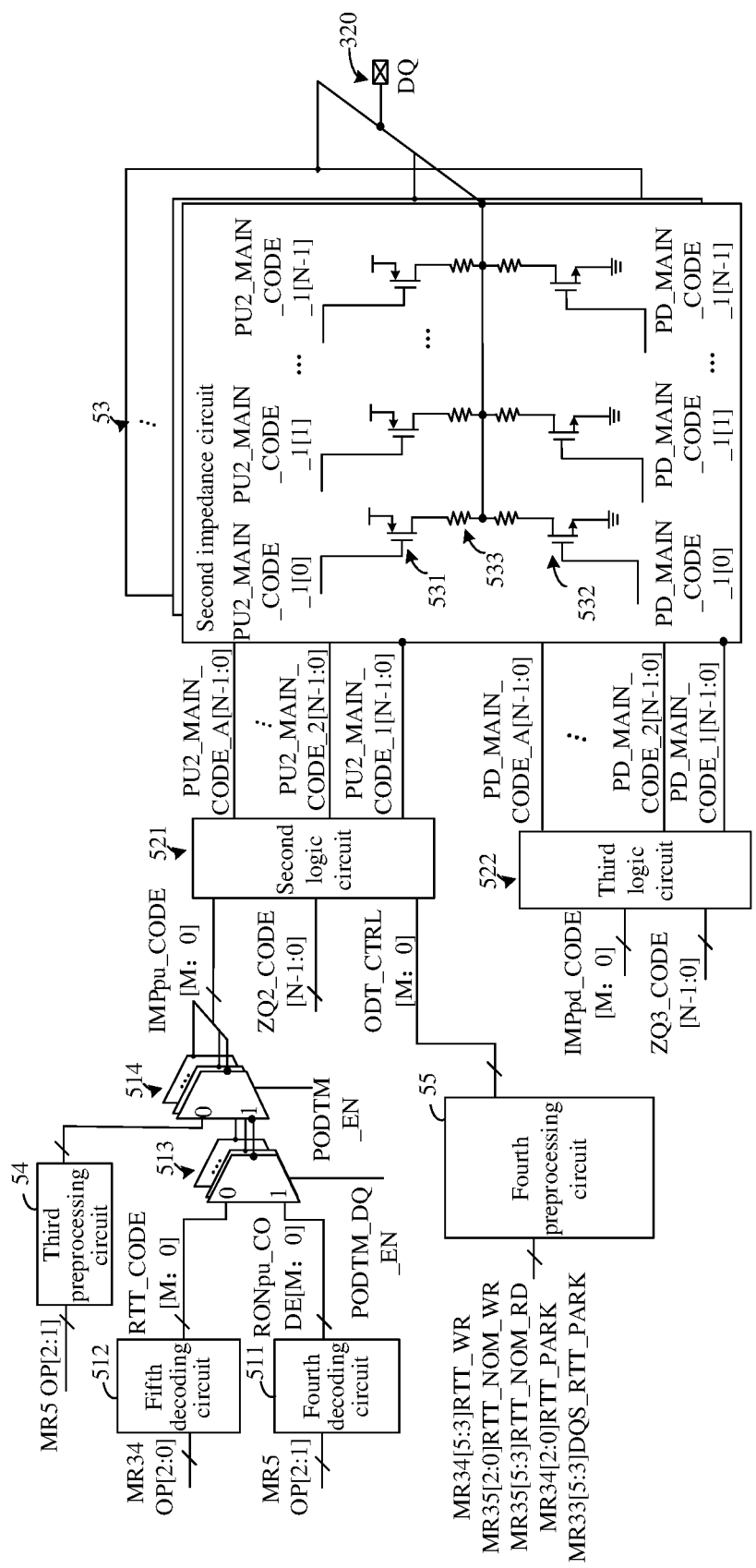
FIG. 11 is a detailed schematic structural diagram II of a second driver circuit according to an embodiment of the present disclosure.

Correspondingly, as shown in FIG. 11, the third impedance control signal is represented by IMPpu_CODE[M:0], the fourth impedance control signal is represented by ODT_CTRL[M:0], and the fifth impedance control signal is represented by IMPpd_CODE[M:0]. Particularly, compared with FIG. 9, the second driver circuit 321 in FIG. 11 also includes the third preprocessing circuit 54 and the fourth preprocessing circuit 55. The third preprocessing circuit 54 is configured to decode the first OP MR5 OP[2:1] to obtain the third non-test state control signal. The fourth preprocessing circuit 55 is configured to determine the fourth impedance control signal according to MR34[5:3] involving RTT_WR, MR35[2:0] involving RTT_NOM_WR, MR35[5:3] involving RTT_NOM_RD, MR34[2:0] involving RTT_PARK, and MR33[5:3] involving DQS_RTT_PARK.

The working principle of the second driver circuit 321 in FIG. 11 is substantially the same as that of the first driver circuit 311 in FIG. 8, which may be correspondingly understood with reference to the foregoing description of FIG. 8 and may not repeated in this embodiment of the present disclosure. In addition, the second driver circuit 321 in FIG. 11 also has an additional control part for the level pull-down impedance, that is, the third logic circuit 522, and its signal processing principle may refer to the following description.

The signal processing process in the second driver circuit 321 will be described below with reference to FIG. 10 or FIG. 11.

In some embodiments, each of the third decoded signal RONpu_CODE[M:0], the fourth decoded signal RTT_CODE[M:0], the third test state control signal, the third non-test state control signal and the third impedance control signal includes (M+1) bits of sub-signals. The third selection circuit 513 includes (M+1) third data selectors. The fourth selection circuit 514 includes (M+1) fourth data selectors. Herein, the input of one of the third data selectors receives a 1-bit sub-signal of the third decoded signal RONpu_CODE[M:0] and a 1-bit sub-signal of the fourth decoded signal RTT_CODE[M:0], the output of one of the third data selectors is configured to output a 1-bit sub-signal of the third test state control signal, and the control ends of all the third data selectors receive the second test flag signal PODTM_DQ_EN. The input of one of the fourth data selectors receives the 1-bit sub-signal of the third test state control signal and a 1-bit sub-signal of the third non-test state control signal, the output of one of the fourth data selectors is configured to output a 1-bit sub-signal of the third impedance control signal, and the control ends of all the fourth data selectors receive the test enable signal PODTM_EN.

It is to be noted that the third test state control signal is represented as the third test state control signal [M:0], the third non-test state control signal is represented as the third non-test state control signal [M:0], and the third impedance control signal is represented as the third impedance control signal [M:0]. In this way, the first third data selector receives RONpu_CODE[0], RTT_CODE[0] and PODTM_DQ_EN respectively, and selects one of RONpu_CODE[0] and RTT_CODE[0] to output the third test state control signal [0] according to PODTM_DQ_EN. The first fourth data selector receives the third test state control signal [0], the third non-test state control signal [0] and PODTM_EN respectively, and selects one of the third test state control signal [0] and the third non-test state control signal [0] to output the third impedance control signal [0] according to PODTM_EN. The other ones may be understood by reference and analogy.

In some embodiments, the fourth impedance control signal includes (M+1) bits of sub-signals. The second calibration signal ZQ2_CODE[N−1:0] and the third calibration signal ZQ3_CODE[N−1:0] include N bits of sub-signals. The second target signal PU2_MAIN_CODE and the third target signal PD_MAIN_CODE include A group of sub-signals. Each group of sub-signals includes N bits of sub-signals. The second driver 53 includes A second impedance circuits, and each second impedance circuit is configured to receive a group of sub-signals in the second target signal PU2_MAIN_CODE and a group of sub-signals in the third target signal PD_MAIN_CODE. Herein, the second logic circuit 521 is specifically configured to determine whether the level pull-up function of the at least one of the second impedance circuits is enabled according to the third impedance control signal and the fourth impedance control signal; and determine, in a case that the level pull-up function of the $a^{th}$ second impedance circuit is enabled, the level state of the $a^{th}$ group of sub-signals in the second target signal PU2_MAIN_CODE according to the second calibration signal ZQ2_CODE[N−1:0], so as to control the resistance value of the second impedance circuit to be a standard resistance value; or, determine, in a case that the level pull-up function of the $a^{th}$ second impedance circuit is disabled, that the $a^{th}$ group of sub-signals in the second target signal PU2_MAIN_CODE are in the first level state. The third logic circuit 522 is specifically configured to determine whether the level pull-up function of the at least one second impedance circuit is enabled according to the fifth impedance control signal; and determine, in a case that the level pull-down function of the $a^{th}$ second impedance circuit is enabled, the level state of the $a^{th}$ group of sub-signals in the third target signal PD_MAIN_CODE according to the third calibration signal ZQ3_CODE[N−1:0], so as to control the resistance value of the second impedance circuit to be a standard resistance value; or, determine, in a case that the level pull-down function of the $a^{th}$ second impedance circuit is disabled, that the $a^{th}$ group of sub-signals in the third target signal PD_MAIN_CODE are in the second level state.

It is to be noted that the valid signal in the third impedance control signal and the fourth impedance control signal and the second calibration signal ZQ2_CODE[N−1:0] are combined through the second logic circuit 521, so as to obtain the second target signal PU2_MAIN_CODE, thereby controlling the level pull-up function of the second impedance circuit. The structure and function of the second logic circuit 521 are substantially the same as those of the first logic circuit 42, and the working principle of the second logic circuit 521 may refer to the above description of the first logic circuit 42 and may not be repeated here.

The third logic circuit 522 is configured to combine the fifth impedance control signal IMPpd_CODE[M:0] and the third calibration signal ZQ3_CODE[N−1:0] to obtain the third target signal PD_MAIN_CODE, so as to control the level pull-down function of the second impedance circuit. Similarly, the 1-bit sub-signal of the fifth impedance control signal IMPpd_CODE[M:0] controls whether the level pull-down function of one or more second impedance circuits is enabled. On this basis, if the level pull-down function of a certain second impedance circuit function is enabled, the pull-down resistance value of the second impedance circuit is calibrated to the standard resistance value by using the third calibration signal ZQ3_CODE[N−1:0], so that the level pull-down function is performed, otherwise if the level pull-down function of the second impedance circuit is disabled, the related circuit of the second impedance circuit is disconnected by using a fixed signal in the second level state.

In some embodiments, each second impedance circuit includes N third switch transistors (for example, the third switch transistor 531 in FIG. 10 or FIG. 11), N fourth switch transistors (for example, the fourth switch transistor 532 in FIG. 10 or FIG. 11) and 2N second resistors (for example, the second resistor 533 in FIG. 10 or FIG. 11). The control end of the $n^{th}$ second switch transistor in the $a^{th}$ third impedance circuit is connected with the $n^{th}$ sub-signal in the $a^{th}$ group of sub-signals in the second target signal, the first end of one of the third switch transistors is connected with the first end of one of the second resistors, and the second end of one of the third switch transistors is connected with a power signal. The control end of the $n^{th}$ fourth switch transistor in the $a^{th}$ second impedance circuit is connected with the $n^{th}$ sub-signal in the $a^{th}$ group of sub-signals in the third target signal, the first end of one of the fourth switch transistors is connected with the ground signal, the second end of one of the fourth switch transistors is connected with the first end of one of the second resistors, and the second ends of the 2N second resistors are all connected with the corresponding DQ.

It is to be noted that in FIG. 10 or FIG. 11, taking the first second impedance circuit as an example, the first second impedance circuit is configured to receive the first group of sub-signals PU2_MAIN_CODE_1[N−1:0] in the second target signal and the first group of sub-signals PD_MAIN_CODE_1[N−1:0] in the third target signal. Herein, PU2_MAIN_CODE_1[N−1:0] includes sub-signals of PU2_MAIN_CODE_1 [0], PU2_MAIN_CODE_1 [1] . . . PU2_MAIN_CODE_1[N−1], and each sub-signal is configured to correspondingly control the working state of one third switch transistor, so as to control the second impedance circuit to perform the level pull-up function with the standard resistance value or not perform the level pull-up function. PD_MAIN_CODE_1[N−1:0] includes sub-signals of PD_MAIN_CODE_1 [0], PD_MAIN_CODE_1 [1] to PD_MAIN_CODE_1[N−1], and sub-signal is configured to correspondingly control the working state of one of the fourth switch transistors, so as to control the second impedance circuit to perform the level pull-down function with the standard resistance value or not perform the level pull-down function.

In addition, in FIG. 10 or FIG. 11, the first second impedance circuit shows the three third switch transistors (only one third switch transistor 531 is numbered), three fourth switch transistors (only one fourth switch transistor 532 is numbered) and six second resistors (only one second resistor 533 is numbered), but in actual scenarios, the number of the third switch transistors/fourth switch transistors/second resistors may all be more or less.

In the foregoing content, the first level state is a high level state, and the second level state is a low level state. The high-level state refers to a level value which makes a N-channel field effect transistor be turned on or a P-channel field effect transistor be turned off. The low-level state refers to a level value which makes the N-channel field effect transistor be turned off or the P-channel field effect transistor be turned on.

Both the first switch transistor and the third switch transistor are P-channel field effect transistors, and the second switch transistor and the fourth switch transistor are N-channel field effect transistors. The control end of the P-channel field effect transistor is a gate electrode, the second end of the P-channel field effect transistor is a source electrode, the first end of the P-channel field effect transistor is a drain electrode, the N-channel field effect transistor is the gate electrode, the second end of the N-channel field effect transistor is the drain electrode, and the first end of the N-channel field effect transistor is the source electrode. The standard resistance value is 240 ohms.

The embodiments of the present disclosure provide the semiconductor memory. When the semiconductor memory is in the preset test mode, the first MR and the second MR related to the DQ are allowed to directly define the impedance of the DM. The DM does not need to add definition of the output driver state and the related control circuit for the preset test mode to ensure that the preset test mode is adapted to the DM. The impedance of the DM may be tested in the preset test mode to avoid the circuit processing errors.

Figure 12:
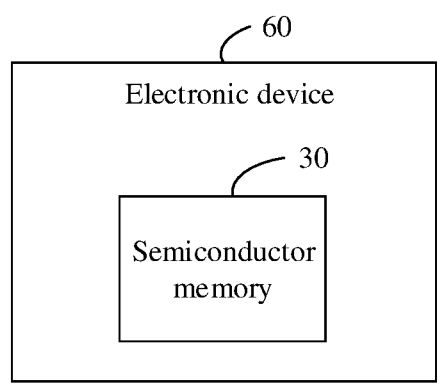
FIG. 12 is a schematic diagram of a composition structure of an electric device according to an embodiment of the present disclosure.

In another embodiment of the present disclosure, referring to FIG. 12, which shows a schematic diagram of a composition structure of an electronic device 60 according to an embodiment of the present disclosure. As shown in FIG. 12, the electronic device 60 may include the semiconductor memory 30 described in any one of the foregoing embodiments.

In the embodiment of the present disclosure, the semiconductor memory 30 may be a DRAM chip.

Further, in some embodiments, the DRAM chip conforms to the memory specification of DDR5.

The embodiments of the present disclosure mainly relate to a control method and a related control circuit for the DM and the DQ of the semiconductor memory. When the semiconductor memory is in the preset test mode, the first MR and the second MR related to the DQ are allowed to directly define the impedance of the DM. For the DM, there is no need to add definition of the output driver state and the related control circuit for the preset test mode to ensure that the preset test mode is adapted to the DM. The impedance of the DM may be tested in the preset test mode to avoid the circuit processing errors.

The above are only the preferred embodiments of the present disclosure, and are not intended to limit the scope of protection of the present disclosure.

It is to be noted that in this disclosure, the terms "including", "containing" or any other variation thereof are intended to cover non-exclusive inclusion, so that a process, method, article or device including a series of elements includes not only those elements, but also other elements not explicitly listed, or elements inherent to the process, method, article or device. Without more restrictions, an element defined by the sentence "including a . . . " does not exclude the existence of other identical elements in the process, method, article, or device including the element.

The above numbers of the embodiments of the present disclosure are only for description, and do not represent the advantages or disadvantages of the embodiments.

The methods disclosed in the several method embodiments provided in the present disclosure may be combined arbitrarily without conflict to obtain new method embodiments.

The features disclosed in the several product embodiments provided in the present disclosure may be combined arbitrarily without conflict to obtain new product embodiment.

The features disclosed in several method or device embodiments provided in the present disclosure may be combined arbitrarily without conflict to obtain new method embodiments or device embodiments.

The above are only the specific implementation modes of the present disclosure and not intended to limit the scope of protection of the present disclosure. Any variations or replacements apparent to those skilled in the art within the technical scope disclosed by the disclosure shall fall within the scope of protection of the present disclosure. Therefore, the scope of protection of the present disclosure shall be subject to the scope of protection of the claims.

Embodiments of the present disclosure provide a control method, a semiconductor memory, and an electronic device. When the semiconductor memory is in a preset test mode, a first MR and a second MR related to a DQ are allowed to directly define the impedance of a DM. For the DM, there is no need to add definition of an output driver state and a related control circuit for the preset test mode to ensure that the preset test mode is adapted to the DM. The impedance of the DM may be tested in the preset test mode to avoid circuit processing errors.

The invention claimed is:

1. A control method, applied to a semiconductor memory, the semiconductor memory comprising a Data Mask Pin (DM), the DM being configured to receive an input mask signal of write data, and the method comprising:
when the semiconductor memory is in a preset test mode,
controlling an impedance of the DM to be a first impedance parameter through a first Mode Register (MR), in response to the DM being selected as a test object; or,
controlling the impedance of the DM to be a second impedance parameter through a second MR, in response to the DM not being selected as the test object;
wherein the semiconductor memory further comprises at least one Data Pin (DQ), the DQ is configured to receive or output data, the first MR is configured to indicate that an impedance of the at least one DQ in an output driver state is the first impedance parameter, and the second MR is configured to indicate that the impedance of the at least one DQ in a termination state is the second impedance parameter.

2. The control method according to claim 1, wherein when the semiconductor memory is in the preset test mode, the method further comprises:
controlling, through the first MR, the impedance of the DQ to be the first impedance parameter, in response to the DQ being selected as the test object; or,
controlling, through the second MR, the impedance of the DQ to be the second impedance parameter, in response to the DQ not being selected as the test object.

3. The control method according to claim 1, wherein the method further comprises:
determining, through a third MR, that the semiconductor memory enters the preset test mode and selects the test object; or,
determining, through the third MR, that the semiconductor memory does not enter the preset test mode.

4. The control method according to claim 3, wherein in a case of determining that the semiconductor memory enters the preset test mode, the method further comprises:
acquiring a first Operand (OP) in the first MR, a second OP in the second MR, and a third OP in the third MR;
decoding the third OP to obtain a first test flag signal; wherein the first test flag signal indicates whether the DM is the test object; and
selecting one of the first OP and the second OP to control the impedance of the DM according to the first test flag signal.

5. The control method according to claim 4, wherein the method further comprises:
determining a first non-test state control signal and a second impedance control signal;
when the semiconductor memory is in the preset test mode, determining, based on one of the first OP and the second OP, a first impedance control signal according to the first test flag signal; or, when the semiconductor memory is not in the preset test mode, determining, based on the first non-test state control signal, the first impedance control signal; and
selecting, according to a working state of the semiconductor memory, one of the first impedance control signal and the second impedance control signal to control the impedance of the DM;
wherein the first non-test state control signal is configured to indicate the impedance of the DM in a state other than the preset test mode, and the second impedance control signal is configured to indicate the impedance of the DQ in the output driver state; or the first non-test state control signal is configured to indicate the impedance of the DQ in the output driver state, and the second impedance control signal is configured to indicate the impedance of the DM in the state other than the preset test mode.

6. The control method according to claim 4, wherein in the case of determining that the semiconductor memory enters the preset test mode, the method further comprises:
decoding the third OP to obtain at least one second test flag signal, wherein one of the at least one second test flag signal indicates whether one of the at least one DQ is the test object; and
selecting, according to the second test flag signal, one of the first OP and the second OP to control the impedance of a respective one of the at least one DQ.

7. The control method according to claim 6, wherein the method further comprises:
determining a third non-test state control signal, a fourth impedance control signal and a fifth impedance control signal;
when the semiconductor memory is in the preset test mode, determining, based on one of the first OP and the second OP, a third impedance control signal according to the second test flag signal; or, when the semiconductor memory is not in the preset test mode, determining, based on the third non-test state control signal, the third impedance control signal; and
selecting, according to a working state of the semiconductor memory, the third impedance control signal and the fifth impedance control signal to control the impedance of the DQ, or selecting, according to the working state of the semiconductor memory, the fourth impedance control signal and the fifth impedance control signal to control the impedance of the DQ;
wherein the third non-test state control signal is configured to indicate the impedance of a corresponding DQ in the termination state, and the fourth impedance control signal and the fifth impedance control signal are jointly configured to indicate the impedance of the corresponding DQ in the output driver state; or the third non-test state control signal and the fifth impedance control signal are jointly configured to indicate the impedance of the corresponding DQ in the output driver state, and the fourth impedance control signal is configured to indicate the impedance of the corresponding DQ in the termination state.

8. The control method according to claim 4, wherein the preset test mode is a Package Output Driver Test Mode (PODTM), and the PODTM is configured to test the impedance of the DM or the at least one DQ after packaging;
 the first MR has a standard serial number of 5, and the first OP refers to an OP from a second bit to a first bit stored in the first MR;
 the second MR has a standard serial number of 34, and the second OP refers to an OP from a second bit to a $0^{th}$ bit stored in the second MR; and
 the third MR has a standard serial number of 61, and the third OP refers to an OP from a $4^{th}$ bit to a $0^{th}$ bit stored in the third MR.

9. A semiconductor memory, comprising a first Mode Register (MR), a second MR, a Data Mask Pin (DM), and a first driver circuit connected to the first MR, the second MR and the DM respectively; wherein
 the DM is configured to receive an input mask signal of write data;
 the first driver circuit is configured to, when the semiconductor memory is in a preset test mode, control an impedance of the DM to be a first impedance parameter according to the first MR in response to the DM being selected as a test object, or control the impedance of the DM to be a second impedance parameter according to the second MR in response to the DM not being selected as the test object;
 wherein the semiconductor memory further comprises at least one Data Pin (DQ), the DQ is configured to receive or output data, the first MR is configured to indicate that an impedance of the at least one DQ in an output driver state is the first impedance parameter, and the second MR is configured to indicate that an impedance of the at least one DQ in a termination state is the second impedance parameter.

10. The semiconductor memory according to claim 9, wherein the semiconductor memory further comprises at least one second driver circuit, and each of the at least one second driver circuit is connected with the first MR, the second MR and one of the at least one DQ; wherein
 the second driver circuit is configured to, when the semiconductor memory is in the preset test mode, control the impedance of the DQ to be the first impedance parameter through the first MR in response to the DQ being selected as the test object, or control the impedance of the DQ to be the second impedance parameter through the second MR in response to the DQ not being selected as the test object.

11. The semiconductor memory according to claim 10, wherein the semiconductor memory further comprises a third MR and a first decoding circuit; wherein
 the first MR is configured to store and output a first Operand (OP);
 the second MR is configured to store and output a second OP;
 the third MR is configured to store and output a third OP; wherein the third OP is configured to indicate whether the semiconductor memory enters the preset test mode;
 the first decoding circuit is configured to receive the third OP, decode the third OP and output a first test flag signal; wherein the first test flag signal is configured to indicate whether the DM is the test object; and
 the first driver circuit is further configured to receive the first test flag signal, the first OP and the second OP; and select one of the first OP and the second OP to control the impedance of the DM according to the first test flag signal in a case that the semiconductor memory enters the preset test mode.

12. The semiconductor memory according to claim 11, wherein the semiconductor memory is further configured to determine a first non-test state control signal, a second impedance control signal and a first calibration signal; wherein the first calibration signal is configured to calibrate a pull-up resistance value;
 the first driver circuit comprises:
  a first signal processing circuit, configured to receive the first test flag signal, the first OP, the second OP and the first non-test state control signal; and output, based on one of the first OP and the second OP, a first impedance control signal according to the first test flag signal when the semiconductor memory is in the preset test mode; or, output, based on the first non-test state control signal, the first impedance control signal when the semiconductor memory is not in the preset test mode;
  a first logic circuit, configured to receive the first impedance control signal, the second impedance control signal and the first calibration signal; and select and logically combine the first impedance control signal, the second impedance control signal and the first calibration signal to output a first target signal; and
  a first driver, comprising a plurality of first impedance circuits and configured to receive the first target signal, and control the plurality of first impedance circuits by using the first target signal, so as to control an impedance of the DM;
 wherein the first non-test state control signal is configured to indicate the impedance of the DM in a state other than the preset test mode, and the second impedance control signal is configured to indicate the impedance of the DQ in the output driver state; or, the first non-test state control signal is configured to indicate the impedance of the DQ in the output driver state, and the second impedance control signal is configured to indicate the impedance of the DM in the state other than the preset test mode.

13. The semiconductor memory according to claim 12, wherein the first signal processing circuit comprises:
 a second decoding circuit, configured to receive the first OP, decode the first OP and output a first decoded signal;
 a third decoding circuit, configured to receive the second OP, decode the second OP and output a second decoded signal;
 a first selection circuit, configured to receive the first test flag signal, the first decoded signal and the second decoded signal; and select one of the first decoded signal and the second decoded signal to output a first test state control signal according to the first test flag signal; and
 a second selection circuit, configured to receive a test enable signal, the first test state control signal and the first non-test state control signal; and select one of the first test state control signal and the first non-test state control signal to output the first impedance control signal according to the test enable signal; wherein the test enable signal is configured to indicate whether the semiconductor memory is in the preset test mode.

14. The semiconductor memory according to claim 13, wherein each of the first decoded signal, the second decoded signal, the first test state control signal, the first non-test state control signal and the first impedance control signal comprises (M+I) bits of sub-signals, the first selection circuit comprises (M+l) first data selectors, and the second selection circuit comprises (M+1) second data selectors; wherein
an input of one of the first data selectors is configured to receive a 1-bit sub-signal of the first decoded signal and a 1-bit sub-signal of the second decoded signal, an output of one of the first data selectors is configured to output a 1-bit sub-signal of the first test state control signal, and control ends of all the first data selectors are configured to receive the first test flag signal;
an input of one of the second data selectors is configured to receive a 1-bit sub-signal of the first test state control signal and a 1-bit sub-signal of the first non-test state control signal, an output of one of the second data selectors is configured to output a 1-bit sub-signal of the first impedance control signal, and the control ends of all the second data selectors are configured to receive the test enable signal;
wherein M is a positive integer.

15. The semiconductor memory according to claim 14, wherein the second impedance control signal comprises (M+1) bits of sub-signals, the first calibration signal comprises N bits of sub-signals, the first target signal comprises A group of sub-signals, and each group of the sub-signals comprises N bits of sub-signals;
the first driver comprises A first impedance circuits, and each of the first impedance circuits is configured to receive a group of sub-signals in the first target signal; wherein
the first logic circuit is specifically configured to determine whether a level pull-up function of at least one of the first impedance circuits is enabled according to the first impedance control signal and the second impedance control signal; and determine, in a case that a level pull-up function of an $a^{th}$ first impedance circuit is enabled, a level state of an $a^{th}$ group of sub-signals in the first target signal according to the first calibration signal, so as to control a resistance value of the $a^{th}$ first impedance circuit to be a standard resistance value; or determine, in a case that the level pull-up function of the $a^{th}$ first impedance circuit is disabled, that the $a^{th}$ group of sub-signals in the first target signal are in a first level state;
wherein each of the first impedance circuits comprises N first switch transistors, N second switch transistors and 2N first resistors, a control end of an $n^{th}$ first switch transistor in the $a^{th}$ first impedance circuit is connected with an $n^{th}$ sub-signal in the $a^{th}$ group of sub-signals in the first target signal, a first end of one of the first switch transistors is connected with a first end of one of the first resistors, and a second end of one of the first switch transistors is connected with a power signal; a control end of one of the second switch transistors is connected with a ground signal, a first end of one of the second switch transistors is connected with the ground signal, a second end of one of the second switch transistors is connected with the first end of one of the first resistors, and second ends of the 2N first resistors are all connected with the DM;
wherein n, a, N, and A are all integers, n is less than or equal to N, a is less than or equal to A, and (M+1) is less than or equal to A.

16. The semiconductor memory according to claim 11, wherein
the first decoding circuit is further configured to decode the third OP and output at least one second test flag signal; wherein one of the at least one second test flag signal is configured to indicate whether one of the at least one DQ is the test object; and
the second driver circuit is further configured to receive a corresponding second test flag signal, the first OP and the second OP; and select, in a case that the semiconductor memory enters the preset test mode, one of the first OP and the second OP to control the impedance of the DQ according to the second test flag signal.

17. The semiconductor memory according to claim 16, wherein the semiconductor memory is further configured to determine a third non-test state control signal, a fourth impedance control signal, a fifth impedance control signal, a second calibration signal and a third calibration signal; wherein the second calibration signal is configured to calibrate a pull-up resistance value, and the third calibration signal is configured to calibrate a pull-down resistance value;
the second driver circuit comprises:
a second signal processing circuit, configured to receive the second test flag signal, the first OP, the second OP and the third non-test state control signal; and output a third impedance control signal based on one of the first OP and the second OP according to the second test flag signal when the semiconductor memory is in the preset test mode; or output the third impedance control signal based on the third non-test state control signal when the semiconductor memory is not in the preset test mode;
a second logic circuit, configured to receive the third impedance control signal, the fourth impedance control signal and the second calibration signal; and select and logically combine the fourth impedance control signal and the second calibration signal to output a second target signal;
a third logic circuit, configured to receive the fifth impedance control signal and the third calibration signal, and logically combine the fifth impedance control signal and the third calibration signal to output a third target signal; and
a second driver, comprising a plurality of second impedance circuits and configured to receive the second target signal and the third target signal, and control the plurality of second impedance circuits by using the second target signal and the third target signal, so as to control the impedance of a corresponding DM;
wherein the third non-test state control signal is configured to indicate the impedance of a corresponding DQ in the termination state, and the fourth impedance control signal and the fifth impedance control signal are jointly configured to indicate the impedance of the corresponding DQ in the output driver state; or the third non-test state control signal and the fifth impedance control signal are jointly configured to indicate the impedance of the corresponding DQ in the output driver state, and the fourth impedance control signal is configured to indicate the impedance of the corresponding DQ in the termination state.

18. The semiconductor memory according to claim 17, wherein the second signal processing circuit comprises:
a fourth decoding circuit, configured to receive the first OP, decode the first OP and output a third decoded signal;
a fifth decoding circuit, configured to receive the second OP, decode the second OP and output a fourth decoded signal;
a third selection circuit, configured to receive the second test flag signal, the third decoded signal and the fourth decoded signal; and select, according to the second test flag signal, one of the third decoded signal and the fourth decoded signal to output a third test state control signal; and a fourth selection circuit, configured to receive a test enable signal, the third test state control signal and the third non-test state control signal, and select, according to the test enable signal, one of the third test state control signal and the third non-test state control signal to output the third impedance control signal; wherein the test enable signal is configured to indicate whether the semiconductor memory is in the preset test mode.

19. The semiconductor memory according to claim 18, wherein each of the third decoded signal, the fourth decoded signal, the third test state control signal, the third non-test state control signal and the third impedance control signal comprises (M+I) bits of sub-signals, the third selection circuit comprises (M+I) third data selectors, and the fourth selection circuit comprises (M+1) fourth data selectors; wherein an input of one of the third data selectors is configured to receive a 1-bit sub-signal of the third decoded signal and a 1-bit sub-signal of the fourth decoded signal, an output of one of the third data selectors is configured to output a 1-bit sub-signal of the third test state control signal, and control ends of all the third data selectors are configured to receive the second test flag signal;

an input of one of the fourth data selectors is configured to receive the 1-bit sub-signal of the third test state control signal and a 1-bit sub-signal of the third non-test state control signal, an output of one of the fourth data selectors is configured to output a 1-bit sub-signal of the third impedance control signal, and control ends of all the fourth data selectors are configured to receive the test enable signal.

20. The semiconductor memory according to claim 19, wherein the fourth impedance control signal comprises (M+1) bits of sub-signals, each of the second calibration signal and the third calibration signal comprises N bits of sub-signals, each of the second target signal and the third target signal comprises A groups of sub-signals, and each group of the sub-signals comprises N bits of sub-signals;

the second driver comprises A second impedance circuits, and each of the second impedance circuits is configured to receive a group of sub-signals in the second target signal and a group of sub-signals in the third target signal; wherein the second logic circuit is specifically configured to determine whether a level pull-up function of the at least one of the second impedance circuits is enabled according to the third impedance control signal and the fourth impedance control signal; and determine, in a case that a level pull-up function of an $a^{th}$ second impedance circuit is enabled, a level state of the $a^{th}$ group of sub-signals in the second target signal according to the second calibration signal, so as to control a resistance value of the second impedance circuit to be a standard resistance value; or, determine, in a case that the level pull-up function of the $a^{th}$ second impedance circuit is disabled, that the $a^{th}$ group of sub-signals in the second target signal are in a first level state;

the third logic circuit is specifically configured to determine whether the level pull-up function of the at least one of the second impedance circuits is enabled according to the fifth impedance control signal; and determine, in the case that a level pull-down function of the $a^{th}$ second impedance circuit is enabled, the level state of the $a^{th}$ group of sub-signals in the third target signal according to the third calibration signal, so as to control the resistance value of the second impedance circuit to be the standard resistance value; or, determine, in the case that the level pull-down function of the $a^{th}$ second impedance circuit is disabled, that the $a^{th}$ group of sub-signals in the third target signal are in a second level state;

wherein each of the second impedance circuits comprises N third switch transistors, N fourth switch transistors and 2N second resistors, a control end of an $n^{th}$ second switch transistor in the $a^{th}$ third impedance circuit is connected with an $n^{th}$ sub-signal in the $a^{th}$ group of sub-signals in the second target signal, a first end of one of the third switch transistors is connected with a first end of one of the second resistors, and a second end of one of the third switch transistors is connected with a power signal; a control end of an $n^{th}$ fourth switch transistor in the $a^{th}$ second impedance circuit is connected with an $n^{th}$ sub-signal in the $a^{th}$ group of sub-signals in the third target signal, a first end of one of the fourth switch transistors is connected with a ground signal, a second end of one of the fourth switch transistors is connected with the first end of one of the second resistors, and second ends of the 2N second resistors are all connected with the DM.

21. The semiconductor memory according to claim 15, wherein the first level state is a high level state, and a second level state is a low level state;

both the first switch transistor and a third switch transistor are P-channel field effect transistors, and both the second switch transistor and a fourth switch transistor are N-channel field effect transistors;

a control end of each of the P-channel field effect transistors is a gate electrode, a second end of each of the P-channel field effect transistors is a source electrode, a first end of each of the P-channel field effect transistors is a drain electrode, a control end of each of the N-channel field effect transistors is the gate electrode, a second end of each of the N-channel field effect transistors is the drain electrode, and a first end of each of the N-channel field effect transistors is the source electrode; and the standard resistance value is 240 ohms.

22. An electronic device, comprising a semiconductor memory comprising: a first Mode Register (MR), a second MR, a Data Mask Pin (DM), and a first driver circuit connected to the first MR, the second MR and the DM respectively; wherein the DM is configured to receive an input mask signal of write data;

the first driver circuit is configured to, when the semiconductor memory is in a preset test mode, control an impedance of the DM to be a first impedance parameter according to the first MR in response to the DM being selected as a test object, or control the impedance of the DM to be a second impedance parameter according to the second MR in response to the DM not being selected as the test object;

wherein the semiconductor memory further comprises at least one Data Pin (DQ), the DQ is configured to receive or output data, the first MR is configured to indicate that an impedance of the at least one DQ in an output driver state is the first impedance parameter, and the second MR is configured to indicate that an impedance of the at least one DQ in a termination state is the second impedance parameter.

* * * * *